(12) United States Patent
Chandrasekaran

(10) Patent No.: US 11,451,131 B2
(45) Date of Patent: Sep. 20, 2022

(54) PULSE TRAIN CONDITIONING CIRCUITS AND RELATED METHODS

(71) Applicant: Texas Instruments Incorporated, Dallas, TX (US)

(72) Inventor: Ramesh Mosur Chandrasekaran, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 341 days.

(21) Appl. No.: 16/727,674

(22) Filed: Dec. 26, 2019

(65) Prior Publication Data

US 2021/0203219 A1 Jul. 1, 2021

(51) Int. Cl.
*H02M 1/088* (2006.01)
*H03K 5/01* (2006.01)
*H02M 3/158* (2006.01)
*H03K 5/00* (2006.01)

(52) U.S. Cl.
CPC .......... *H02M 1/088* (2013.01); *H02M 3/158* (2013.01); *H03K 5/01* (2013.01); *H03K 2005/00195* (2013.01)

(58) Field of Classification Search
CPC ........ H02M 1/088; H02M 3/158; H03K 5/01; H03K 2005/00195
USPC ........................................................ 323/311
See application file for complete search history.

(56) References Cited

U.S. PATENT DOCUMENTS

| | | | |
|---|---|---|---|
| 10,784,867 B1* | 9/2020 | Kanteti | H03K 19/018521 |
| 2005/0201128 A1* | 9/2005 | Jin | H02M 1/34 |
| | | | 363/56.01 |
| 2016/0087518 A1* | 3/2016 | Agarwal | H02M 1/00 |
| | | | 323/271 |
| 2019/0028089 A1* | 1/2019 | R R | H03K 3/012 |
| 2019/0222207 A1* | 7/2019 | Soundararajan | H03M 1/50 |

* cited by examiner

*Primary Examiner* — Yemane Mehari
(74) *Attorney, Agent, or Firm* — Mark A. Valetti; Charles A. Brill; Frank D. Cimino

(57) ABSTRACT

Pulse train conditioning circuits and related methods are disclosed. An example circuit includes a first transistor having a first current terminal and a first gate terminal, a second transistor having a second current terminal and a second gate terminal, a third transistor having a third current terminal and a third gate terminal, a fourth transistor having a fourth current terminal and a fourth gate terminal, the fourth gate terminal coupled to the first through third gate terminals, a first switch having first through third terminals, the first terminal coupled to the first current terminal, the second terminal coupled to the third current terminal, and the third terminal coupled to the fourth current terminal, and a second switch having fourth through sixth terminals, the fourth terminal coupled to the second current terminal, the fifth terminal coupled to the third current terminal, and the sixth terminal coupled to the fourth current terminal.

20 Claims, 9 Drawing Sheets

| CODE | NUMERATOR | DENOMINATOR | RATIO | MULT |
|---|---|---|---|---|
| 0 | 1 | 32 | 0.03125 | |
| 1 | 2 | 31 | 0.064516 | 2.06 |
| 2 | 3 | 30 | 0.1 | 1.55 |
| 3 | 4 | 29 | 0.137931 | 1.38 |
| 4 | 5 | 28 | 0.178571 | 1.29 |
| 5 | 6 | 27 | 0.222222 | 1.24 |
| 6 | 7 | 26 | 0.269231 | 1.21 |
| 7 | 8 | 25 | 0.32 | 1.19 |
| 8 | 9 | 24 | 0.375 | 1.17 |
| 9 | 10 | 23 | 0.434783 | 1.16 |
| 10 | 11 | 22 | 0.5 | 1.15 |
| 11 | 12 | 21 | 0.571429 | 1.14 |
| 12 | 13 | 20 | 0.65 | 1.14 |
| 13 | 14 | 19 | 0.736842 | 1.13 |
| 14 | 15 | 18 | 0.833333 | 1.13 |
| 15 | 16 | 17 | 0.941176 | 1.13 |
| 16 | 17 | 16 | 1.0625 | 1.13 |
| 17 | 18 | 15 | 1.2 | 1.13 |
| 18 | 19 | 14 | 1.357143 | 1.13 |
| 19 | 20 | 13 | 1.538462 | 1.13 |
| 20 | 21 | 12 | 1.75 | 1.14 |
| 21 | 22 | 11 | 2 | 1.14 |
| 22 | 23 | 10 | 2.3 | 1.15 |
| 23 | 24 | 9 | 2.666667 | 1.16 |
| 24 | 25 | 8 | 3.125 | 1.17 |
| 25 | 26 | 7 | 3.714286 | 1.19 |
| 26 | 27 | 6 | 4.5 | 1.21 |
| 27 | 28 | 5 | 5.6 | 1.24 |
| 28 | 29 | 4 | 7.25 | 1.29 |
| 29 | 30 | 3 | 10 | 1.38 |
| 30 | 31 | 2 | 15.5 | 1.55 |
| 31 | 32 | 1 | 32 | 2.06 |

PULSE TRAIN CONDITIONING CIRCUITS AND RELATED METHODS

FIELD OF THE DISCLOSURE

This disclosure relates generally to pulse train conditioning circuits and, more particularly, to pulse train conditioning circuits and related methods.

BACKGROUND

Electronic circuits have a propagation or time delay between inputs and outputs. Time delays may vary within an integrated circuit due to manufacturing process variations. Time delays within an integrated circuit associated with a power converter can affect operation of the power converter. Trim circuits can be utilized in the integrated circuit associated with the power converter to adjust time delays to affect the operation of the power converter.

BRIEF DESCRIPTION OF THE DRAWINGS

FIG. 7 is a table including example current ratios corresponding to the example implementation of the delay logic of FIGS. 3-4.

DETAILED DESCRIPTION

Figure 1:
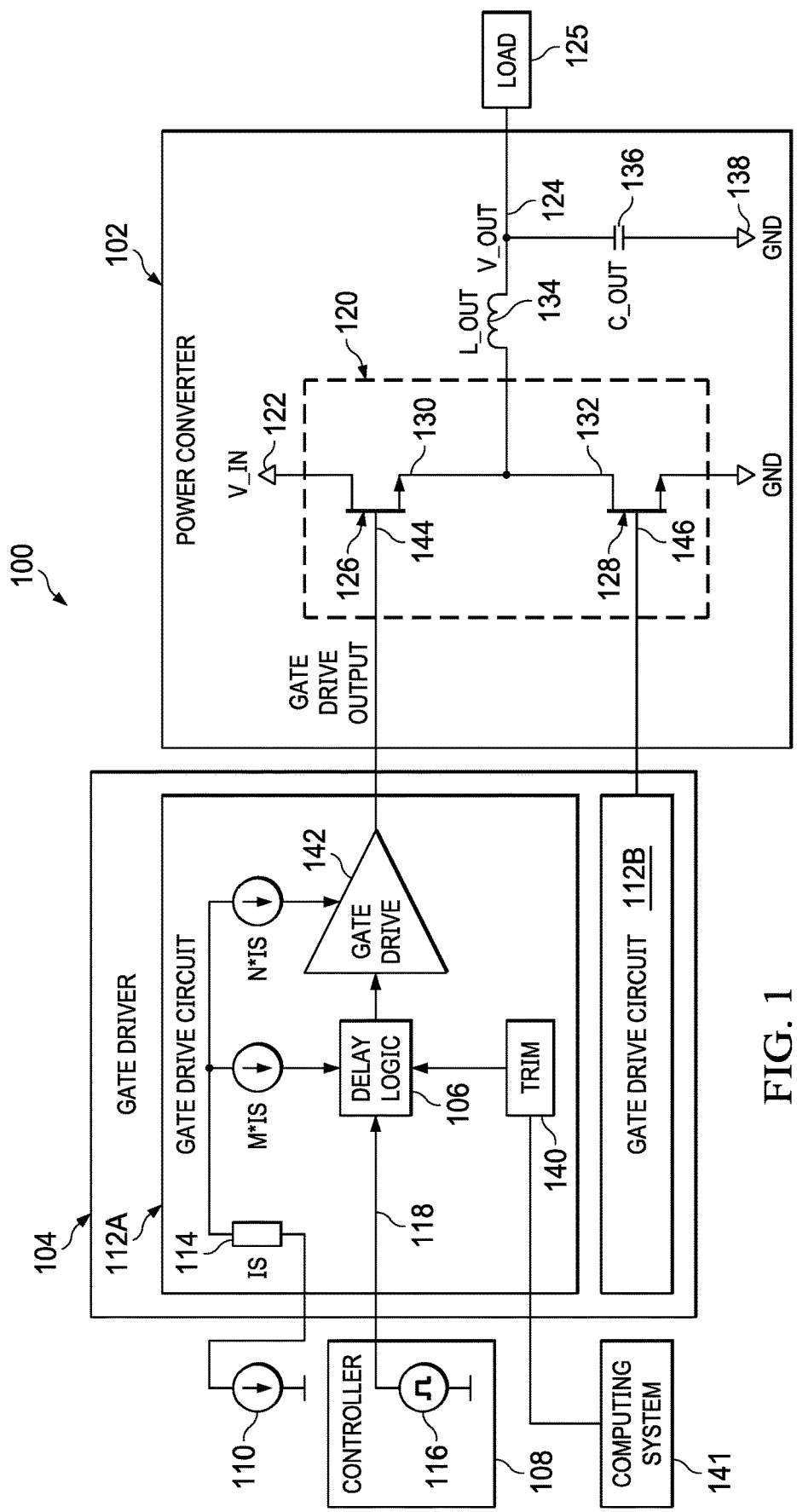
FIG. 1 depicts an example power conversion system including a controller, a power converter, and a gate driver including delay logic to control operation of the power converter.

The figures are not to scale. In general, the same reference numbers will be used throughout the drawing(s) and accompanying written description to refer to the same or like parts. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other.

Descriptors "first," "second," "third," etc. are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

Integrated circuits are electrical circuits composed of individual electrical components or elements. The elements must be properly connected to each other to form an interconnect network. Through the interconnect network, an element may obtain an input signal and process the input signal to generate an output signal. The output signal may be transmitted to another element within the interconnect network. An integrated circuit operation to obtain, process, generate, and/or transmit a signal can cause propagation delay in connection with the signal.

The propagation delay of a signal is a relatively small, yet finite, amount of time between the input and the output of an element. To control propagation delay, integrated circuits may include trim circuits that include trimmable delay elements to harmonize delay between integrated circuits. For example, different integrated circuits may generate similar outputs with different delays as a result of variations in manufacturing. The trim circuits may be used to adjust the different delays to be within a specified tolerance so that the different delays are substantially similar.

In some instances, a trim circuit may switch between different states to affect an output of the trim circuit. A first state may correspond to charging a capacitor (e.g., charging a fully discharged capacitor) included in the trim circuit and a second state may correspond to discharging the capacitor (e.g., discharging a fully charged capacitor). Active switching elements may control the transition between states to increase or decrease a delay of transmitting a signal to a different circuit, device, etc., such as a gate driver, a power converter, etc., coupled to the trim circuit.

Conventional trim circuits including a first trim circuit and a second trim circuit may provide selectable delay but require a significant number of elements for resolution at larger delay values. The first trim circuit may be a voltage-based delay circuit. Disadvantageously, once a delay trim associated with the first trim circuit is completed, the delay trim becomes fixed and cannot be changed for each application and/or with variations in temperature. Accordingly, the first trim circuit is a static trim circuit and cannot be changed in operation. The second trim circuit may be a current-based delay circuit. Disadvantageously, both the first and second trim circuits may consume a relatively large portion of an integrated circuit to implement exponential delay variation. Advantageously, examples disclosed herein improve conventional trim circuits, such as the first and second trim circuit, by providing dynamically selectable and dynamically continuous delay control with a significantly smaller area compared to the conventional trim circuits.

The first trim circuit may include a chain of digital or resistor-capacitor (RC) unit delays with trim. The first trim circuit may provide selectable delay, where the delay is dependent on component parameters. An output from the first trim circuit may vary with manufacturing and/or temperature variations. Accordingly, cumulative error and/or variations may be relatively large in instances where multiple ones of the first trim circuit are in series. In some instances, the first trim circuit may have a large dynamic range as a result of the first trim circuit having a correspondingly large area to implement linear delay variation. In such instances, the first trim circuit can have a greater dynamic range by increasing the quantity of components included in the first trim circuit that, in turn, increases the area of the first trim circuit.

The second trim circuit may include a current-based digital-to-analog converter (DAC) delay circuit. The second trim circuit may provide a selectable and continuous delay. In some instances, the second trim circuit may control delay better than the first trim circuit because the second trim circuit can control delay based on current, unlike the aforementioned first trim circuit that is RC based, which is affected by process and/or temperature variations. Like the first trim circuit, the second trim circuit may have a large dynamic range as a result of the second trim circuit having a correspondingly large area to implement exponential delay variation.

Example delay circuits (e.g., pulse train conditioning circuits) disclosed herein reduce pulse delay differences between integrated circuit dies and/or between batches of integrated circuit dies as a result of application level delay choice, manufacturing variations, temperature variations, etc. Example delay circuits disclosed herein can reduce pulse delay differences by providing exponential delay variation for selectable delay control and using current for continuous delay control.

Example delay circuits disclosed herein implement exponential delay variation by controlling a delay of a signal (e.g., a rising edge of a signal, a falling edge of a signal, etc.) based on an approximation of an exponential function. For example, the delay circuits can generate a non-linear change in delay output based on a linear change in selection input. Example delay circuits disclosed herein include one or more switches, such as transistors, for the selectable delay control. For example, one or more switches can be disabled, enabled, etc., to select a specified delay of an output. In such examples, the delay circuits can generate the non-linear change in delay output by making a linear adjustment, such as turning on, turning off, etc., one or more of the one or more switches. Example delay circuits disclosed herein include dynamically adjustable one or more current sources. For example, the delay circuits disclosed herein can facilitate the continuous delay control by adjusting the one or more current sources.

Example delay circuits disclosed herein utilize exponential delay variation to reduce area (e.g., a portion of area available to an integrated circuit, a portion of area included in an integrated circuit, etc.) compared to areas associated with the first or second trim circuits described above. For example, to achieve a 10-bit delay range with 5-bit control, example delay circuits disclosed herein can include 32 units (e.g., 32 transistors, 32 circuits, etc.) in an example exponential delay variation delay circuit. In such examples, the 32 circuits are less than 1024 units needed to achieve the same 10-bit delay range using the first or second trim circuits described above. As the first and second trim circuits implement linear control, the first and second trim circuits need 10-bit control (e.g., 1024 units) to implement a 10-bit delay range. Advantageously, the example delay circuits disclosed herein can include a fewer number of transistors and/or other hardware components than may be required to implement the first or second trim circuits as described above.

Example delay circuits disclosed herein can control a delay on one or both edges (e.g., a rising edge, a falling edge, etc.) of a signal (e.g., a pulse) by controlling a discharge time of capacitors. For example, the delay circuits can include current mirrors to control one or more transistors operative as current sinks to discharge capacitors of the delay circuits at a controlled rate to provide delay at one or both edges.

In some disclosed examples, switches of the delay circuits are set based on a switch setting code obtained from trim memory. For example, the switches can control transistors to generate a current ratio to control a delay of a signal (e.g., a power converter enable signal to be transmitted to a power converter). In such examples, the current ratio can provide the exponential delay variation for the selectable control delay. The controller can control the switches to generate a current ratio that can sweep a dynamic delay range based on the approximation of the exponential function. For example, the controller can control a trim circuit to configure and/or otherwise set the switches in a desired configuration.

FIG. 1 depicts an example implementation of a power conversion system 100 including a power converter 102 and a gate driver 104 including delay logic 106 to control operation of the power converter 102. In FIG. 1, the power conversion system 100 includes an example controller 108 to control and/or otherwise invoke the gate driver 104 to turn off, turn on, etc., the power converter 102.

In the illustrated example of FIG. 1, the controller 108 is coupled to the gate driver 104 via one or more pins (e.g., integrated circuit (IC) pins), one or more electrical contacts, etc., and/or a combination thereof. In some examples, the controller 108 can be implemented using hardware logic, machine readable instructions, hardware implemented state machines, etc., and/or a combination thereof. For example, the controller 108 can be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)). In other examples, the controller 108 can be implemented using a transconductance amplifier (i.e., a GM amplifier).

In the illustrated example of FIG. 1, an example current generator 110 transmits an example current IS 114 to control a first example gate drive circuit 112A included in the gate driver 104. For example, the current generator 110 can correspond to a resistor or other discrete hardware component on a printed-circuit board on which the gate driver 104 is included. In such examples, the current IS 114 can be set external to the gate driver 104 while the current IS 114 can be sensed and/or otherwise measured internally to the gate driver 104.

In the illustrated example of FIG. 1, the controller 108 includes an example control signal generator 116 to control the first gate drive circuit 112A. In FIG. 1, the control signal generator 116 generates an example control signal 118 and transmits the control signal 118 to the delay logic 106 included in the first gate drive circuit 112A. In FIG. 1, the control signal 118 is a square-wave signal that corresponds to a gate drive input. Alternatively, the control signal 118 may be any other type of pulse signal.

In the illustrated example of FIG. 1, the power conversion system 100 includes the power converter 102 to convert a first example voltage (V_IN) (e.g., an input voltage) 122 to a second example voltage (V_OUT) (e.g., an output voltage) 124. In FIG. 1, the power converter 102 is coupled to an example load 125. For example, the load 125 can correspond to an electric vehicle, one or more batteries in the electric vehicle, an electric motor in the electric vehicle, a traction inverter included in the electric vehicle, etc.

In the illustrated example of FIG. 1, the power stage 120 includes a first example transistor 126 and a second example transistor 128. In FIG. 1, the transistors 126, 128 are N-channel field-effect transistors (FETs). For example, the transistors 126, 128 can be Gallium Nitride (GaN) FETs (e.g., GaN metal-oxide semiconductor FETs (MOSFETs)), Silicon Carbide (SiC) FETs (e.g., SiC MOSFETs), Silicon (Si) FETs (e.g., Si MOSFETs), etc.

In the illustrated example of FIG. 1, a first current terminal (e.g., a source, a source terminal, etc.) 130 of the first transistor 126 is coupled to a second current terminal (e.g., a drain, a drain terminal, etc.) 132 of the second transistor 128. In FIG. 1, the first current terminal 130 and the second current terminal 132 are coupled to a first end of an example inductor 134 having an inductance of L_OUT. In FIG. 1, a second end of the inductor 134 is coupled to a first end of an example capacitor 136 having a capacitance of C_OUT. In FIG. 1, the second transistor 128 and a second end of the capacitor 136 are coupled to an example reference voltage rail (e.g., a ground rail) 138.

In the illustrated example of FIG. 1, the gate driver 104 is coupled to the power converter 102. In FIG. 1, the gate driver 104 includes (1) the first gate drive circuit 112A to control the first transistor 126 and (2) a second example gate drive circuit 112B to control the second transistor 128. In FIG. 1, the first gate driver circuit 112A and the second gate drive circuit 112B are integrated circuits. In FIG. 1, the second gate drive circuit 112B is a copy or an instance of the first gate drive circuit 112A. Alternatively, the second gate drive circuit 112B may be different from the first gate drive circuit 112A.

In the illustrated example of FIG. 1, the first gate drive circuit 112A includes the delay logic 106, an example trim circuit 140, and an example gate drive 142. In FIG. 1, the delay logic 106 is a circuit (e.g., a delay circuit, a delay logic circuit, etc.). For example, the delay logic 106 can include one or more components (e.g., a resistor, a capacitor, etc.), one or more amplifiers (e.g., a differential amplifier, an operational amplifier, etc.), one or more transistors, etc., and/or a combination thereof.

In the illustrated example of FIG. 1, the first gate drive circuit 112A includes the delay logic 106 to delay transmission, propagation, etc., of the control signal 118 to the gate drive 142 using selectable control to generate exponential-type or based delay (e.g., an exponential delay, an approximated exponential delay, a substantially exponential delay, etc.). In some examples, the delay logic 106 includes a plurality of switches coupled to a respective transistor to adjust a rate of discharging of a charge storage element or device (e.g., a capacitor). For example, the delay logic 106 can implement the selectable control by opening, closing, etc., one or more of the plurality of switches to adjust a discharge current path from the capacitor, etc. In such examples, the delay logic 106 can generate the exponential delay based on an arrangement, coupling, structuring, etc., of the plurality of the transistors included in the delay logic 106.

In some examples, the trim circuit 140 stores a configuration (e.g., a trim configuration, a delay configuration, etc.), a setting (e.g., a trim setting, a delay setting, etc.), etc. For example, the trim circuit 140 can be set and/or otherwise configured by an IC manufacturer, an end-user, a customer, etc. In FIG. 1, the trim circuit 140 is coupled and/or otherwise in circuit or communication with an example computing system 141. For example, the computing system 141 can be a mobile device (e.g., an Internet-enabled smartphone or table), a laptop computer, a server, etc. In such examples, the computing system 141 can include, correspond to, and/or otherwise be representative of automated test equipment.

In some examples, the trim circuit 140 includes memory (e.g., trim memory) that stores one or more digital words. For example, the trim memory can correspond to a set of one or more registers that can each be loaded with a number (e.g., a trim) to determine a delay based on specified conditions. In some examples, the one or more digital words can be 5-bit digital words representative of 5-bit codes. For example, the computing system 141 can transmit a command, a machine readable instruction, etc., representative of a 5-bit digital word (e.g., '00101') to the trim circuit 140. In such examples, in response to obtaining the command, the trim circuit 140 can determine the 5-bit digital word based on the command (e.g., based on interpreting signal(s) corresponding to the command) and store the 5-bit digital word in the trim memory.

In some examples, the trim circuit 140 controls the plurality of switches based on a trim setting corresponding to the one or more digital words. For example, the trim circuit 140 can determine a 5-bit digital word of '00101' based on the command. In such examples, the trim circuit 140 can map the 5-bit digital word of '00101' to a trim setting that corresponds to a quantity of switches to control. For example, the trim circuit 140 can map the 5-bit digital word of '00101' to a quantity of 32 switches to control. In such examples, the trim circuit 140 can control switches to couple transistors associated with a capacitor to increase or decrease a discharge rate of the capacitor. Advantageously, the delay logic 106 can selectively control an increase or a decrease of a delay in transmitting the control signal 118 based on a quantity of transistors adaptively coupled to the capacitor. Advantageously, the delay logic 106 can facilitate non-linear changes in delay in response to linear, discrete, or incremental changes in a quantity of the transistors to be coupled to the capacitor.

In the illustrated example of FIG. 1, the trim circuit 140 is a circuit. For example, the trim circuit 140 can include one or more components (e.g., a resistor, a capacitor, etc.), one or more amplifiers (e.g., a differential amplifier, an operational amplifier, etc.), one or more transistors, etc., and/or a combination thereof. In FIG. 1, the gate drive 142 is a circuit. For example, the gate drive 142 can include one or more FETs, one or more bipolar junction transistors (BJTs), etc. An output of the trim circuit 140 is coupled to a first input of the delay logic 106.

In the illustrated example of FIG. 1, a first output of the delay logic 106 is coupled to a first input of the gate drive 142. In FIG. 1, a first output of the gate drive 142 is coupled to a first example gate (e.g., a gate terminal) 144 of the first transistor 126. In FIG. 1, an output of the second gate drive circuit 112B is coupled to a second example gate 146 of the second transistor 128.

In example operation, the current generator 110 generates and transmits (e.g., continuously transmits) IS 114 to a second input of the delay logic 106 and a second input of the gate drive 142. For example, the current generator 110 can facilitate continuous delay control by the delay logic 106 by generating (e.g., continuously generating) IS 114. In example operation, the controller 108 generates and transmits the control signal 118 to a third input of the delay logic 106. In example operation, the trim circuit 140 can adjust the delay based on a code, a setting, etc., stored in memory of the trim circuit 140. In example operation, the trim circuit 140 can invoke one or more switches included in the delay logic 106 to change states (e.g., from closed to open, from open to closed, etc.) to adjust a discharge current associated with a capacitor of the delay logic 106.

In example operation, the delay logic 106 can increase or decrease a delay of the control signal 118 by coupling one or more corresponding transistors to a discharge current path associated with the capacitor of the delay logic 106. In example operation, the delay logic 106 can increase or decrease a delay of the control signal 118 by de-coupling one or more corresponding transistors from the discharge current path associated with the capacitor. Advantageously, the delay logic 106 can adaptively adjust the delay of the control signal 118 based on a code, a configuration, etc., stored in trim memory, the current IS 114 set by the current generator 110, etc., and/or a combination thereof.

Figure 2:
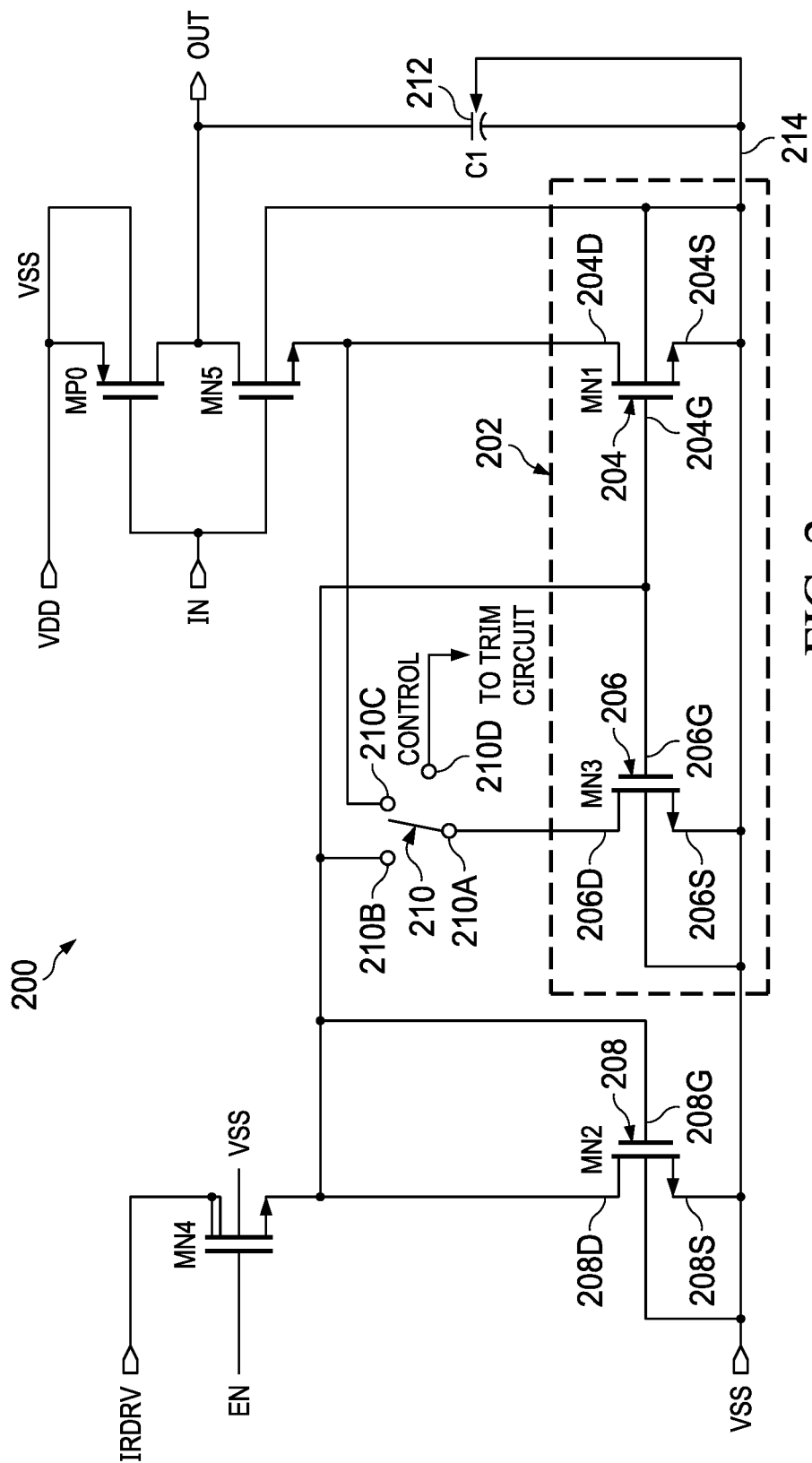
FIG. 2 is a schematic illustration of an example implementation of the delay logic of FIG. 1.

FIG. 2 is a schematic illustration of an example delay circuit 200 including an example current mirror circuit 202. The delay circuit 200 of FIG. 2 is an example implementation of the delay logic 106 of FIG. 1. The current mirror circuit 202 includes a first example transistor (MN1) 204 having a gate (e.g., a gate terminal) 204G, a drain (e.g., a current terminal, a drain terminal, etc.) 204D, and a source (e.g., a current terminal, a source terminal, etc.) 204S. The current mirror circuit 202 includes a third example transistor (MN3) 206 having a gate 206G, a drain 206D, and a source 206S. In FIG. 2, the delay circuit 200 includes a second example transistor (MN2) 208 having a gate 208G, a drain 208D, and a source 208S. In FIG. 2, the first, second, and third transistors 204, 206, 208 are N-channel FETs (e.g., N-channel MOSFETs). Alternatively, one or more of the transistors 204, 206, 208 may be a different type of FET, a BJT, etc.

In the illustrated example of FIG. 2, MN1 204, MN2 208 and MN3 206 are coupled in a current mirror arrangement. In FIG. 2, the gate 204G of MN1 204 is coupled to the gate 206G of MN3 206. In FIG. 2, the source 204S of MN1 204 is coupled to the source 206S of MN3 206. In FIG. 2, the delay circuit 200 includes an example switch 210 having a first example switch terminal 210A, a second example switch terminal 210B, a third example switch terminal 210C, and a fourth example switch terminal (e.g., a control terminal, a switch control terminal, etc.) 210D. In FIG. 2, the drain 206D of MN3 206 is coupled to the first switch terminal 210A, the drain 208D of MN2 208 is coupled to the second switch terminal 210B, and the drain 204D of MN1 204 is coupled to the third switch terminal 210C.

In the illustrated example of FIG. 2, the delay circuit 200 includes the switch 208 to adjust a coupling of the drain 206D of MN3 206 to generate different current ratios. For example, the trim circuit 140 of FIG. 1 can transmit a first control signal to the fourth switch terminal 210D to invoke and/or otherwise cause the switch 210 to couple the first switch terminal 210A to the second switch terminal 210B. In such examples, an example capacitor 212 included in the delay circuit 200 can discharge at a first discharge rate. For example, the switch 210 can couple the drain 206D of MN3 206 to the drain 208D of MN2 208 to prevent discharge of the capacitor 212 through MN3 206.

In some examples, the trim circuit 140 can transmit a second control signal to the fourth switch terminal 210D to invoke and/or otherwise cause the switch 210 to couple the first switch terminal 210A to the third switch terminal 210C. In such examples, the capacitor 212 can discharge at a second discharge rate that is greater than the first discharge rate. For example, the switch 210 can couple the drain 206D of MN3 206 to the drain 204D of MN1 204 to adjust a discharge path of the capacitor 212 to flow through MN1 204 and MN3 206. Advantageously, by adjusting the coupling of the transistors 206, 208 in the current mirror circuit 202, the current mirror circuit 202 can cause exponentially scaled discharge current to flow from the capacitor 212 to an example reference rail 214 via MN3 206 and/or any additional transistors coupled to the capacitor 212.

Figure 3:
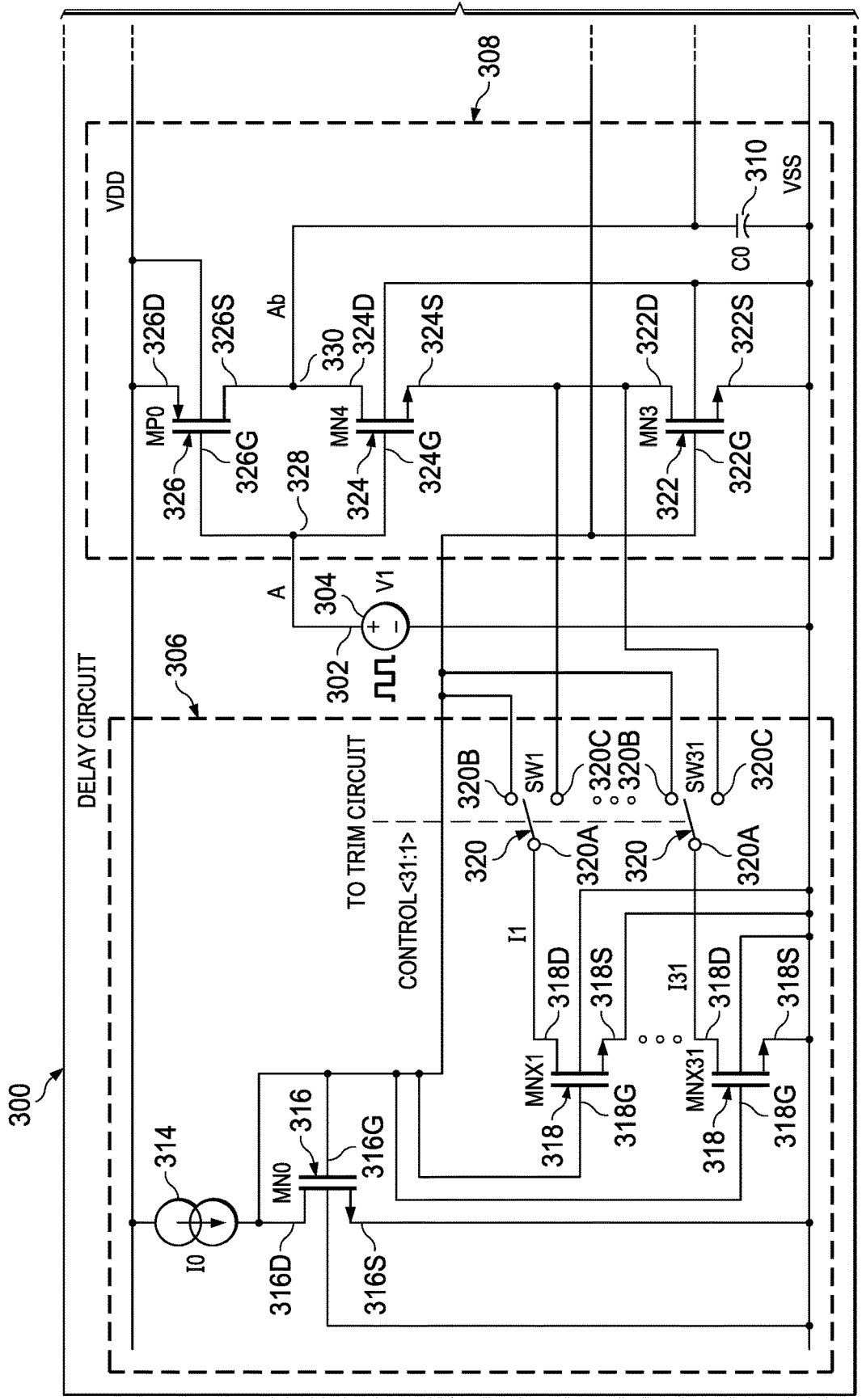
FIGS. 3-4 depict another example implementation of the delay logic of FIG. 1.
Figure 4:
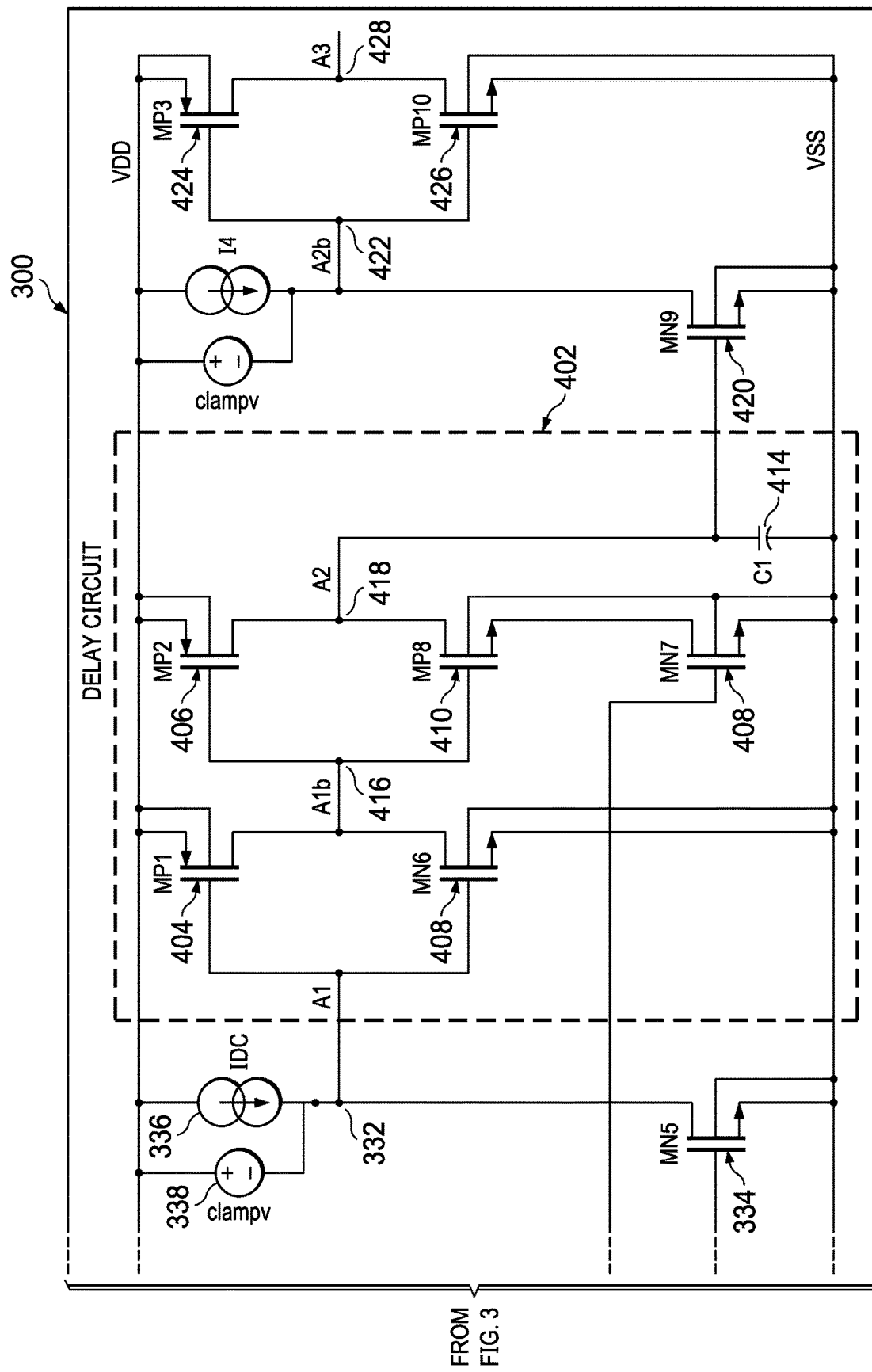

FIGS. 3-4 depict an example delay circuit (e.g., a pulse train conditioning circuit) 300 to delay an example signal (e.g., a pulse signal, a pulse train, a pulse train signal, etc.) 302 generated by an example signal source 304. In some examples, the signal 302 corresponds to the control signal 118 of FIG. 1. In some examples, the signal source 304 corresponds to the controller 108 of FIG. 1. In FIG. 3, the delay circuit 300 is another example implementation of the delay logic 106 of FIG. 1. For example, the delay circuit 300 can correspond to the current mirror circuit 200 of FIG. 2. In FIG. 3, the delay circuit 300 can selectively control an exponential delay of the signal 302. In some examples, the exponential delay can span multiple magnitudes from a first end of the selective control to a second end of the selective control, where the first end is opposite the second end. For example, the delay circuit 300 of FIG. 3 can generate a 10-bit range of delay (e.g., a range of 1024 units of delay) based on 5-bit range of control (e.g., a range of 32 units of control). In such examples, each setting of the 5-bit control can generate more than one unit of delay. Advantageously, the delay circuit 300 can generate exponential delay based on linear control.

In the illustrated example of FIG. 3, the delay circuit 300 includes an example discharge current control circuit 306 and a first example delay unit 308. In FIG. 3, the delay circuit 300 includes the discharge current control circuit 306 to control a discharge rate of an example capacitor (C0) 310 included in the delay circuit 300. In FIG. 3, the delay circuit 300 includes the first delay unit 308 to delay transmission of the signal 302 to a different delay unit, a different circuit, etc., based on the discharge rate of the capacitor 310.

In the illustrated example of FIG. 3, the discharge current control circuit 306 includes an example drive current (IDRV) 314, a first example transistor (MN0) 316, second example transistors (MNX1-MNX31) 318, and example switches (SW1-SW31) 320. For example, IDRV 314 can correspond to and/or otherwise be set by M*IS of FIG. 1. In other examples, IDRV 314 can correspond to IDRV of FIG. 2. In FIG. 3, the second transistors 318 can be discharge current transistors. For example, one(s) of the second transistors 318 can cause a change in a discharge rate of the capacitor 310 in response to a change in state(s) of the one(s) of the second transistors 318, where the change in state can be a change from open to closed (e.g., the transistor changes from not conducting current to conducting current), closed to open (e.g., the transistor changes from conducting current to not conducting current), etc. In FIG. 3, MN0 316 and/or any of one or more of MNX1-MNX31 318 that are coupled to a drain 316D of MN0 316 can correspond to a transistor array. In FIG. 3, the switches 320 correspond to a switch array. In FIG. 3, the discharge current control circuit 306 can implement continuous control of the delay of the signal 302 by changing and/or otherwise adjusting IDRV 314.

In the illustrated example of FIG. 3, the discharge current control circuit 306 includes 31 of the second transistors 318, however, only two are depicted for clarity. Alternatively, the discharge current control circuit 306 may include fewer or more than 31 of the second transistors 318. In FIG. 3, the first transistor 316 and the second transistors 318 are N-channel FETs (e.g., N-channel MOSFETs). In FIG. 3, MN0 316, the second transistors 318, and a third example transistor (MN3) 322 have substantially the same size and/or substantially the same electrical, physical, etc., characteristics. In some examples, MN3 322 can be included in and/or otherwise correspond to the discharge current control circuit 306. In some examples, MN3 322 can be included in and/or otherwise correspond to the delay unit 308.

In the illustrated example of FIG. 3, the discharge current control circuit 306 includes 31 of the switches 320, however, only two are depicted for clarity. Alternatively, the discharge current control circuit 306 may include fewer or more than 31 of the switches 320. In FIG. 3, the switches 320 are transistors (e.g., FETs). Alternatively, one or more of the switches 320 may be implemented with different hardware.

In the illustrated example of FIG. 3, a first example gate 316G of the first transistor 316 is coupled to a first example drain 316D of the first transistor, and second example gates 318G of the second transistors 318. For example, the gate 318G of MNX1 318 is coupled to the gate 318G of MNX2 318, the gate 318G of MNX31, etc. In FIG. 3, a first example source 316S is coupled to second example sources 318S and a second end of the capacitor 310. For example, the source 318S of MNX1 318 is coupled to the source 318S of MNX2 318, the source 318S of MNX31, etc.

In the illustrated example of FIG. 3, the switches 320 have example terminals (e.g., switch terminals, switch contacts, etc.) 320A, 320B, 320C including a first example terminal 320A, a second example terminal 320B, and a third example terminal 320C. In FIG. 3, second example drains 318D of the second transistors 318 are coupled to respective first terminals 320A of the switches 320. For example, the drain 318D of MNX1 318 is coupled to the first terminal 320A of SW1 320, the drain 318D of MNX2 318 is coupled to the first terminal 320A of SW2 320, the drain 318D of MNX31 318 is coupled to the first terminal 320A of SW31 320, etc.

In the illustrated example of FIG. 3, a trim circuit, such as the trim circuit 140 of FIG. 1, controls the switches 320. For example, the trim circuit 140 of FIG. 1 can control one or more of the switches 320 to switch from a first switch position, a first switch contact (e.g., the second terminal 320B), a first state (e.g., a first switch state), etc., to a second switch position, a second switch contact (e.g., the third terminal 320C), a second state (e.g., a second switch state), etc. In FIG. 3, the second terminals 320B of the switches 320 are coupled to the first drain 316D, the first gate 316G, the second gates 318G, and a third example gate 322G of MN3 322. In FIG. 3, the third terminals 320C of the switches 320 are coupled to a third example drain 322D of MN3 322.

In the illustrated example of FIG. 3, a first switch position can correspond to one of the drains 318D of the second transistors 318 coupled to the drain 316D of MN0 316. For example, a first switch position of SW1 320 can correspond to the drain 318D of MNX1 318 coupled to the drain 316D of MN0 316 when the first terminal 320A of SW1 320 is coupled to the second terminal 320B of SW1 320. In FIG. 3, a second switch position can correspond to the one of the drains 318D of the second transistors 318 coupled to the third drain 322D of MN3 322. For example, a second switch position of SW1 320 can correspond to the drain 318D of MNX1 318 coupled to the third drain 322D when the first terminal 320A of SW1 320 is coupled to the third terminal 320C of SW1 320.

In the illustrated example of FIG. 3, the MN3 322 is a N-channel FET. For example, a second switch position of SW1 320 can correspond to the drain 318D of MNX1 318 coupled to the third drain 322D of MN3 322. In FIG. 3, the discharge current control circuit 306 includes MN0 316 to generate a bias voltage, a gate voltage, etc., associated with MN3 322. For example, MN0 316 can have a gate voltage at the first gate 316G that causes the same gate voltage to be generated at the third gate 322G of MN3 322.

In the illustrated example of FIG. 3, the first delay unit 308 includes the capacitor 310, the third transistor 322, a fourth example transistor MN4 324, and a sixth example transistor MP0 326. In FIG. 3, MN4 is a N-channel FET. In FIG. 3, MP0 is a P-channel FET (e.g., a P-channel MOSFET). In FIG. 3, the coupling of MP0 326 and MN4 324 form and/or otherwise correspond to an inverter (e.g., an inverter logic circuit). In FIG. 3, a gate 326G of MP0 326 is coupled to a gate 324G of MN4 324 and the first end of the signal source 304. In FIG. 3, the signal source 304 generates an input pulse train (e.g., the signal 302, the control signal 118 of FIG. 1, etc.). In FIG. 3, a drain 326D of MP0 326 is coupled to a drain 324D of MN4 324 and a first end of the capacitor 310. In FIG. 3, a source 324S of MN4 324 is coupled to the drain 322D of MN3 322 and the third terminal 320C.

In example operation, the trim circuit 140 of FIG. 1 can adjust as switch position of one or more of the switches 320. For example, the trim circuit 140 can adjust SW1-SW10 to move to the second switch position while SW11-SW31 remain in the first switch position. In such examples, a respective drain 318D of MNX1-MNX10 318 can be coupled to the drain 316D of MN0 316 and a respective drain 318D of MNX11-MNX31 318 can be coupled to the drain 322D of MN3. In other examples, the trim circuit 140 can adjust SW11-SW31 to move from the second switch position to the first switch position.

In example operation, a discharge current associated with C0 310 can be determined by the example of Equation (1) below:

$$I_{DISCHARGE} = I_{DRV} * \frac{\text{NUMERATOR}}{\text{DENOMINATOR}} \qquad \text{Equation (1)}$$

In the example of Equation (1) above, $I_{DISCHARGE}$ corresponds to a discharge current, or a first current flowing from C0 310 to discharge C0 310, $I_{DRV}$ corresponds to IDRV 314, and NUMERATOR corresponds to a first quantity of the second transistors 318 that are coupled to the third drain 322D of MN3 322, and DENOMINATOR corresponds to a second quantity of the second transistors 318 that are coupled to the first drain 316D of MN0 316. In the example of Equation (1) above, the ratio of NUMERATOR and DENOMINATOR corresponds to a current ratio. For example, the discharge current can have a value based on a multiplication of the drive current and the current ratio.

Advantageously, C0 310 can be discharged quicker by increasing a ratio of the NUMERATOR and the DENOMINATOR. Further description in connection with the NUMERATOR is described below in connection with the second column 704 of the table 700 of FIG. 7. Further description in connection with the DENOMINATOR is described below in connection with the third column 706 of the table 700 of FIG. 7. Further description in connection with the current ratio is described below in connection with the fourth column 708 of the table 700 of FIG. 7.

In example operation, a logic low signal (e.g., a current, a voltage, etc., corresponding to a digital zero) is present at a first example node (A) 328. For example, the logic low signal can correspond to a falling edge of the signal 302. Other nodes of interest in FIGS. 3-4 include a second example node (Ab) 330 and a third example node (A1) 332. In example operation, the logic low signal (e.g., the falling edge of the signal 302) turns on MP0 326 and turns off MN4 324. In example operation, MN3 322 is always turned on. In example operation, MP0 326 conducts current and causes the capacitor 310 to be charged. In example operation, a fifth example transistor MN5 334 included in the delay circuit 300 turns on in response to the capacitor 310 having a voltage that meets and/or otherwise satisfies a turn-on threshold voltage of MN5 334. In example operation, an example current IDC 336 flows through MN5 334. IDC 336 flowing through MN5 334 results in the first node 328 being low (e.g., a logic low signal). For this transition from high to low at the first node 328, the delay incurred in transmitting a logic low from the signal source 304 to the third node 332 is minimal as charge-up current of C0 310 is not restricted. In the delay circuit 300, a first end of an example voltage clamp 338 is coupled to the source 326S of MP0 326. In example operation, the voltage clamp 338 takes IDC 336 when MN5 334 is off, which causes a logic high signal at the third node 332.

In example operation, the signal source 304 can generate a square wave signal as the signal 302 to cause a logic high signal (e.g., a current, a voltage, etc., corresponding to a digital one) to be present at the first node 328. For example, the logic high signal can correspond to a rising edge of the signal 302. In such examples, the signal 302 can correspond to the control signal 118 of FIG. 1. In example operation, the logic high signal (e.g., the rising edge of the signal 302) turns off MP0 326 and turns on MN4 324. In example operation, current from the capacitor 310 flows through MN4 324, MN3 322, and MNX1-MNX10 318. This discharge current is set by the gate voltage at the gate 322G of MN3 322, where the gate voltage is developed, generated, etc., by (1) MN0 316 and (2) MNX11-MNX31, which behave like MN0 316 when coupled to the drain 316D of MN0 316. In example operation, MN5 334 turns off in response to discharging the capacitor 310 below the turn-on threshold voltage of MN5 334. For example, a change in coupling of one(s) of MNX11-MNX31 from MN0 316 to MN3 322 (or from MN3 322 to MN0 316) can cause a change in the bias voltage, the gate voltage, etc., at the gate terminals of MN0 316, MN3 322, MNX11-MNX31, etc. In example operation, in response to turning off MN5 334, IDC 336 does not flow through MN5 334 as described below in connection with FIG. 4 and the third node 332 is pulled high. For this transition from low to high, the delay incurred in transmitting a logic high from the first node 328 to the third node 332 is controlled (e.g., not minimal) as the charge-down current of C0 310 is restricted as determined by IDRV 314 (e.g., as determined by the example of Equation (1) above).

In the illustrated example of FIG. 3, the delay circuit 300 can increase a discharge rate of the capacitor 310 by switching one or more of SW11-SW31 320 from the first switch position to the second switch position. In some examples, for each one of SW11-SW31 320 that are switched by the trim circuit 140, a non-linear or non-proportional change in a time delay of propagating the signal 302 to a different delay unit can be facilitated. Advantageously, the delay circuit 300 of FIG. 3 can execute selective control by controlling one or more of the switches 320 to facilitate an exponential-based change in time delay output of the signal 302.

Turning to the illustrated example of FIG. 4, the delay circuit 300 includes a second example delay unit 402. The delay circuit 300 of FIGS. 3-4 is a two-unit delay chain including the first delay unit 308 and the second delay unit 402. In FIG. 4, the second delay unit 402 includes example P-channel FETs MP1 404 and MP2 406. In FIG. 4, the second delay unit 402 includes example N-channel FETs MN6 408, MN7 410, and MN8 412. In FIG. 4, the second delay unit 402 includes another example capacitor C1 414.

In example operation, in response to turning off MN5 334, a logic high signal is present at the third node 332. In example operation, the logic high signal turns off MP1 404 and turns on MN6 408 causing a logic low signal to be present at a fourth example node (A1b) 416. The logic low signal at the fourth node 416 turns on MP2 406 and turns off MN6 410 causing a logic high signal to be present at a fifth example node (A2) 418 and, thus, charge C1 414. In example operation, in response to charging C1 414 to generate a voltage that meets and/or otherwise satisfies a turn-on voltage threshold of MN9 420 to turn on MN9 420 and cause a logic low signal to be present at a sixth example node (A2b) 422. In response to turning on MN9 420, MP3 424 turns on and MN10 426 turns off to cause a logic high signal to be present at a seventh example node (A3) 428. In some examples, the seventh node 428 is coupled to the gate drive 142 of FIG. 1 to turn on the first transistor 126 of the power converter 102 of FIG. 1. For example, the first delay unit 308 is coupled to the second delay unit 402 and the second delay unit 402 is coupled to the power converter 102 of FIG. 1. In such examples, the first delay unit 308, the second delay unit 402, etc., can delay a switching operation associated with the power converter by delaying a propagation of the signal 302 of FIG. 3. Advantageously, the delay circuit 300 of FIGS. 3-4 can execute selective control by controlling one or more of the switches 320 of FIG. 3 to facilitate an exponential-based change in time delay output of the signal 302 from the first node 328 to the seventh node 428. In some examples, only one edge of the signal 302 is delayed. For example, the first delay unit 308 can directly drive the gate driver 104 of FIG. 1 that drives the power converter 102 of FIG. 1.

Figure 5:
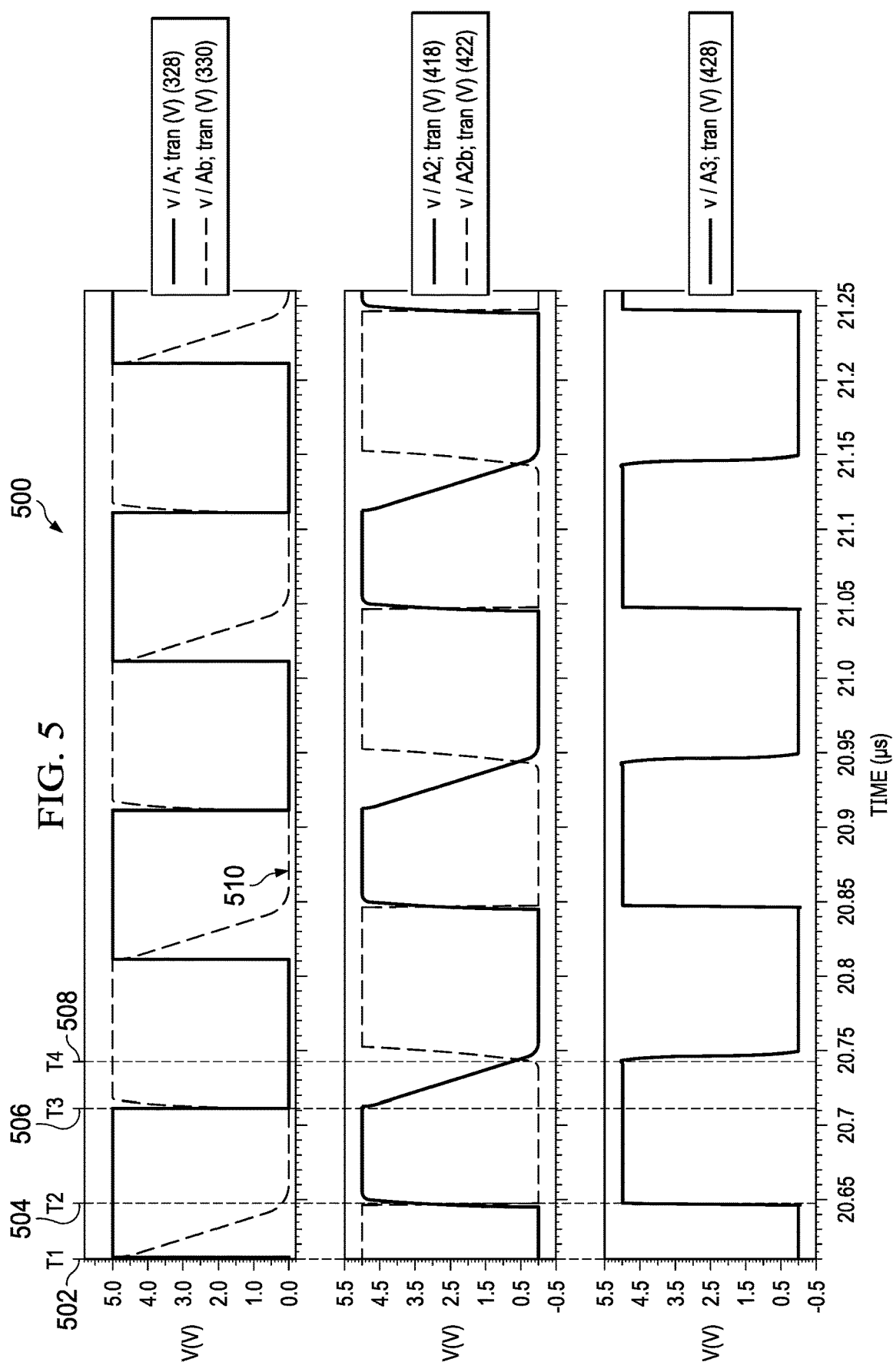
FIG. 5 depicts an example timing diagram corresponding to operation of the example implementation of the delay logic of FIGS. 3-4.

FIG. 5 depicts a first example timing diagram 500 corresponding to example operation of the delay circuit 300 of FIGS. 3-4 and/or, more generally, the delay logic 106 of FIG. 1. In FIG. 5, the first timing diagram 500 depicts example waveforms of signals at the first node 328, the second node 330, the fifth node 418, the sixth node 422, and the seventh node 428 of FIGS. 3 and/or 4. For example, the waveforms of FIG. 5 can correspond to the signal 302 being propagated, transmitted, etc., to different nodes of the delay circuit 300.

In the illustrated example of FIG. 5, at a first example time (T1) 502, the signal source 304 generates a logic high signal for the signal 302 of FIG. 3. At the first time 502, the first node 328 has a first voltage corresponding to the logic high signal and the second node 330 has the first voltage corresponding to the voltage of the capacitor 310 (e.g., the capacitor 310 is fully or substantially charged). The first voltage turns off MP0 326 and turns on MN4 324. In response to turning on MN4 324, the capacitor 310 discharges current through MN4 324, MN3 322, and one or more of the second transistors 318 that are coupled to MN3 322.

In the illustrated example of FIG. 5, at a second example time (T2) 504, the voltage of the capacitor 310 drops below a turn-on threshold voltage of MN5 334 causing a logic high signal to be present at the third node 332. The logic high signal at the third node 332 turns on MN6 408 to cause a logic low signal to be present at the fourth node 416. At the second time 504, the logic low signal at the fourth node 416 turns on MP2 406 to cause a logic high signal to be present at the fifth node 418 as depicted in FIG. 5. At the second time 504, the logic high signal at the fifth node 418 turns off MN9 420 causing a logic low signal to be present at the sixth node 422.

In the illustrated example of FIG. 5, at a third example time (T3) 506, the signal source 304 generates a logic low signal for the signal 302 causing the logic low signal to be present at the first node 328. At the third time 506, the logic low signal at the first node 328 turns on MP0 326 and turns off MN4 324 to cause a logic high signal to appear at the second node 330. At the third time 506, the logic high signal at the second node 330 turns on MN5 334 causing a logic low signal to appear at the third node 332. The logic low signal at the third node 332 turns on MP1 404 and turns off MN6 408 causing a logic high signal to be present at the fourth node 416. The logic high signal at the fourth node 416 turns off MP2 406 and turns on MN8 410 causing current from C1 414 to flow through MN8 410 and MN7 408, which causes the voltage at the fifth node 418 to decrease from the third time 506 until at least a fourth example time (T4) 508. At the fourth time 508, MN9 420 turns off in response to C1 414 discharging below a turn-on threshold voltage of MN9 420. In response to turning off MN9 420, a logic high signal is present at the sixth node 422 causing MP3 424 to turn off and MN10 426 to turn on causing a logic low signal at the seventh node 428.

In the timing diagram 500 of FIG. 5, the delay circuit 300 of FIGS. 3-4 and/or, more generally, the delay logic 106 of FIG. 1 can increase a discharge rate of C0 310 by switching one or more of SW11-SW31 320 from the first switch position to the second switch position while at the same increase the gate voltage for an increased discharge rate. In the timing diagram 500 of FIG. 5, the discharge rate is represented by a first example waveform 510 corresponding to voltage at the second node 330. For example, the delay circuit 300 can increase the discharge rate and, thus, decrease a time to reduce the voltage at the second node 330 from the first voltage to a second voltage, where the second voltage is substantially zero.

In the illustrated example of FIG. 5, the discharge rate of C0 310 (e.g., the discharge rate represented by the first waveform 510) corresponds to a first time duration beginning at the first time 502 and ending at substantially the second time 504. In some examples, for each one of SW1-SW31 320 of FIG. 3 that are switched by the trim circuit 140, a non-linear or non-proportional change in a time delay of propagating the signal 302 to a different delay unit can be facilitated. For example, the trim circuit 140 can selectively control one or more of SW1-SW31 320 to switch from the first switch position to the second switch position to reduce the first time duration to a second time duration, where the second time duration is less than the first time duration. In such examples, the second time duration can correspond to a time duration beginning at the first time 502 and end before the second time 504.

Advantageously, the delay circuit 300 of FIGS. 3-4 can execute selective control by controlling one or more of the switches 320 to facilitate an exponential-based change in time delay output of the signal 302 by increasing the discharge rate of C0 310 as depicted in the timing diagram 500 of FIG. 5. In some examples, by increasing the discharge rate, the delay circuit 300 can decrease a time delay associated with the propagation of the signal 302 to the seventh node 428 and, ultimately, to the power converter 102 of FIG. 1. In some examples, the delay circuit 300 delays only one edge of the signal 302 and, thus, can decrease a time delay associated with the propagation of the signal 302 to the third node 332, the fifth node 418, the sixth node 422, the seventh node 428, etc. In some examples, by decreasing the discharge rate, the delay circuit 300 can increase a time delay associated with the propagation of the signal 302 to the seventh node 428 and, ultimately, to the power converter 102 of FIG. 1.

Figure 6:
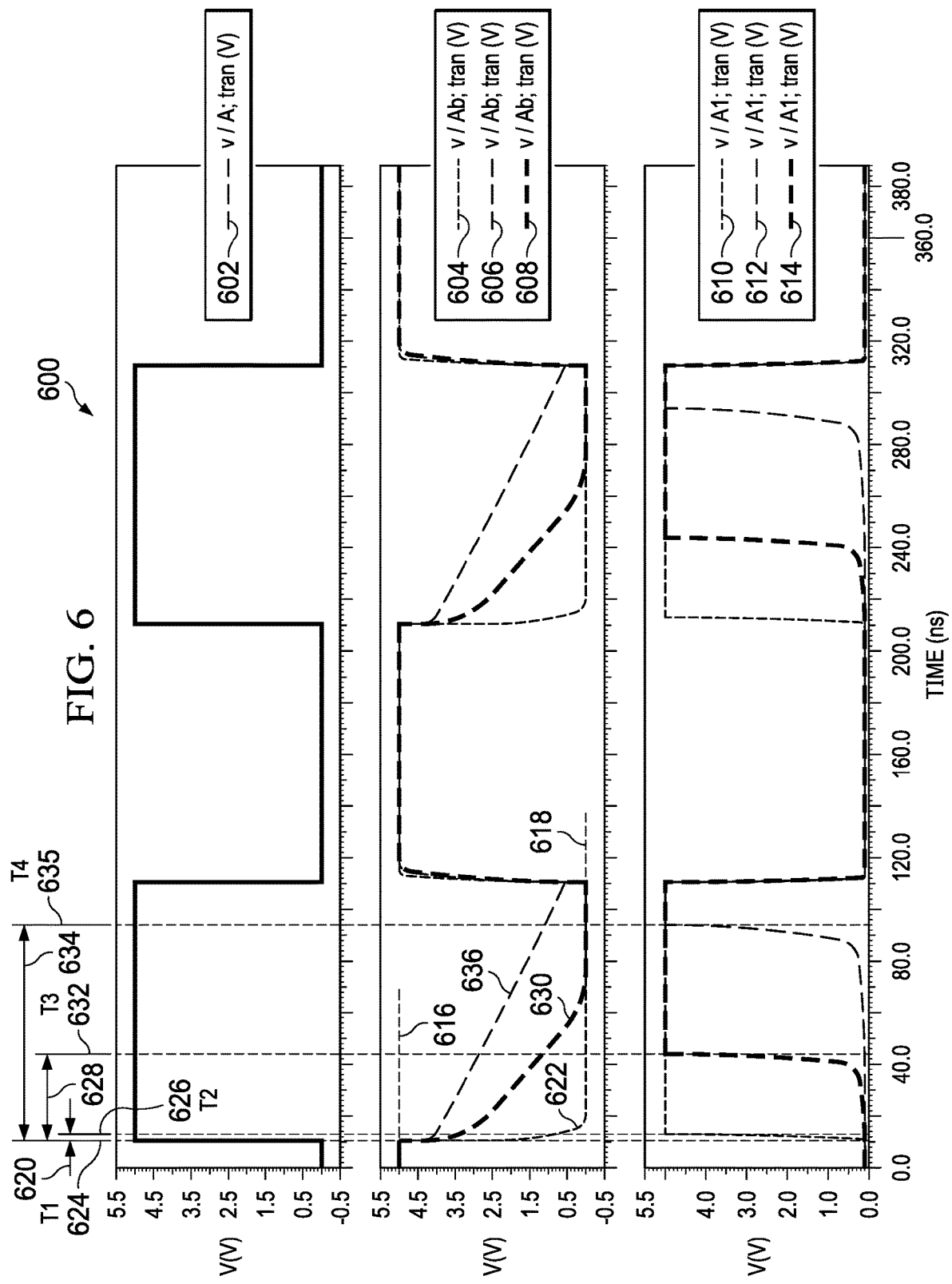
FIG. 6 depicts another example timing diagram corresponding to operation of the example implementation of the delay logic of FIGS. 3-4.

FIG. 6 depicts a second example timing diagram 600 corresponding to example operation of the delay circuit 300 of FIGS. 3-4 and/or, more generally, the delay logic 106 of FIG. 1. The second timing diagram 600 depicts example waveforms 602, 604, 606, 608, 610, 612, 614. In FIG. 6, the waveforms 602, 604, 606, 608, 610, 612, 614 include a first example waveform 602 corresponding to a voltage at the first node 328 of FIGS. 3-4. In FIG. 6, the waveforms 602, 604, 606, 608, 610, 612, 614 include a second example waveform 604 corresponding to a voltage at the second node 330 of FIGS. 3-4 based on a first delay generation setting. In FIG. 6, the waveforms 602, 604, 606, 608, 610, 612, 614 include a third example waveform 606 corresponding to a voltage at the second node 330 based on a second delay generation setting. In FIG. 6, the waveforms 602, 604, 606, 608, 610, 612, 614 include a fourth example waveform 608 corresponding to a voltage at the second node 330 based on a third delay generation setting.

In the illustrated example of FIG. 6, the waveforms 602, 604, 606, 608, 610, 612, 614 include a fifth example waveform 610 corresponding to a voltage at the third node 332 of FIG. 4 based on the first delay generation setting. In FIG. 6, the waveforms 602, 604, 606, 608, 610, 612, 614 include a sixth example waveform 612 corresponding to a voltage at the third node 332 based on the second delay generation setting. In FIG. 6, the waveforms 602, 604, 606, 608, 610, 612, 614 include a seventh example waveform 614 corresponding to a voltage at the third node 332 based on the third delay generation setting.

In the illustrated example of FIG. 6, the first delay generation setting corresponds to a first quantity of the second transistors 318 being coupled to the drain 322D of MN3 322 of FIG. 3 and a second quantity of the second transistors 318 being coupled to the first drain 316D of MN0 316 of FIG. 3. For example, the first quantity can be 31 and the second quantity can be 0. In such examples, MNX1-MNX30 318 can be coupled to MN3 322 and none of 318 coupled to MN0 316.

In the illustrated example of FIG. 6, the second delay generation setting corresponds to a third quantity of the second transistors 318 being coupled to the drain 322D of MN3 322 of FIG. 3 and a fourth quantity of the second transistors 318 being coupled to the first drain 316D of MN0 316 of FIG. 3. The third quantity is less than the first quantity and the fourth quantity is more than the second quantity. For example, the third quantity can be 12 and the fourth quantity can be 19. In such examples, MNX1-MNX11 318 can be coupled to MN3 322 and MNX12-MNX31 318 can be coupled to MN0 316.

In the illustrated example of FIG. 6, the third delay generation setting corresponds to a fifth quantity of the second transistors 318 being coupled to the drain 322D of MN3 322 of FIG. 3 and a sixth quantity of the second transistors 318 being coupled to the first drain 316D of MN0 316 of FIG. 3. The fifth quantity is less than the third quantity and the sixth quantity is more than the fourth quantity. For example, the fifth quantity can be 7 and the sixth quantity can be 24. In such examples, MNX1-MNX6 318 can be coupled to MN3 322 and MNX7-MNX31 318 can be coupled to MN0 316.

In the second timing diagram 600 of FIG. 6, the first delay generation setting generates a first current path from C0 310.

In FIG. 6, the first current path causes the voltage at the second node 330 to decrease from a first example voltage 616 to a second example voltage 618 during a first example time duration 620. The first time duration 620 corresponds to a first example discharge rate 622 of C0 310. In FIG. 6, the first time duration 620 begins substantially at a first example time (T1) 624 and ends substantially at a second example time (T2) 626. In FIG. 6, the first waveform 602 is representative of the voltage at the first node 328 corresponding to a logic high signal at the first time 624. In FIG. 6, the fourth waveform 610 is representative of the voltage at the third node 332 corresponding to a logic high signal at the second time 626.

In the second timing diagram 600 of FIG. 6, the second delay generation setting generates a second current path from C0 310 different from the first current path. In FIG. 6, the second current path causes the voltage at the second node 330 to decrease from the first voltage 616 to the second voltage 618 during a second example time duration 628. The second time duration 628 corresponds to a second example discharge rate 630 of C0 310. In FIG. 6, the second time duration 628 begins substantially at the first time 624 and ends substantially at a third example time (T3) 632.

In the second timing diagram 600 of FIG. 6, the third delay generation setting generates a third current path from C0 310 different from the first and second current paths. In FIG. 6, the third current path causes the voltage at the second node 330 to decrease from the first voltage 616 to the second voltage 618 during a third example time duration 634. The third time duration 634 corresponds to a third example discharge rate 636 of C0 310. In FIG. 6, the third time duration 634 begins substantially at the first time 624 and ends substantially at a fourth example time (T4) 635.

Advantageously, the delay circuit 300 of FIGS. 3-4 can generate exponential-based delay generation in response to linear control. For example, the delay circuit 300 can individually and/or otherwise independently change switch positions of the switches 320 of FIG. 3. By changing delay generation settings, the delay circuit 300 can adjust one or more of the switches 320 to switch between switch positions to generate different current paths associated with C0 310. As depicted in the second timing diagram 600 of FIG. 6, the delay circuit 300 can cause non-linear and/or otherwise non-proportional changes in the time durations 620, 628, 634 based on linear control of the switches 320.

As depicted in the second timing diagram 600 of FIG. 6, by increasing the quantity of the second transistors 318 being coupled to the drain 322D of MN3 322 of FIG. 3, while simultaneously reducing the quantity of the second transistors 318 being coupled to the drain 316D of MN0 316, the discharge rates 622, 630, 636 can increase (e.g., changing from the second or third delay generation setting to the first delay generation setting). As depicted in the second timing diagram 600 of FIG. 6, by decreasing the quantity of the second transistors 318 being coupled to the drain 322D of MN3 322 of FIG. 3 while simultaneously increasing the quantity of the second transistors 318 being coupled to the drain 316D of MN0 316, the discharge rates 622, 630, 636 can decrease (e.g., changing from the first delay generation setting to the second or third delay generation setting).

FIG. 7 is an example table 700 corresponding to example data that can be stored in memory of the trim circuit 140 and/or, more generally, the gate driver 104 of FIG. 1. The table 700 of FIG. 7 includes a first example column 702, a second example column 704, a third example column 706, a fourth example column 708, and a fifth example column 710.

In the table 700 of FIG. 7, the first column 702 includes example codes (e.g., switch setting codes, data values, etc.) in a range of 0 to 31. Although the codes are depicted in FIG. 7 in decimal format, the codes can be stored in any other machine readable format such as in binary (e.g., in a range from binary 00000 to binary 11111), hexadecimal (e.g., in a range from 0x0 to 0x1F), etc. For example, the codes included in the first column 702 can be stored as 5-bit digital words in trim memory of the trim circuit 140 of FIG. 1. The codes depicted in the first column 702 are representative of 5-bit selective control that can be executed by the trim circuit 140 of FIG. 1 and/or, more generally, the delay logic 106 of FIG. 1.

In the table 700 of FIG. 7, the second column 704 includes numerator values in a range of 1 to 32. The numerator values depicted in the second column 704 are representative of a quantity of transistors coupled to C0 310 of FIGS. 3-4, a quantity of transistors that correspond to and/or otherwise form a current path from C0 310, etc. For example, a numerator value of 7 can correspond to (1) the third drain 322D of MN3 322 and (2) the drains 318D of MNX1-MNX6 coupled to the first end of C0 310.

In the table 700 of FIG. 7, the third column 706 includes denominator values in a range of 1 to 32. The denominator values depicted in the third column 706 are representative of a quantity of transistors coupled to MN0 316 of FIGS. 3-4, a quantity of transistors that correspond to and/or otherwise form a current path, etc. For example, a denominator value of 26 can correspond to (1) the first drain 316D of MN0 316 and (2) the drains 318D of MNX7-MNX31 coupled to the first end of IDRV 314 of FIG. 3.

In the table 700 of FIG. 7, the fourth column 708 includes ratio values, such as current ratio values, in a range of 0.03125 to 32. The ratio values depicted in the fourth column 708 are representative of a ratio of a numerator value and a corresponding denominator value. For example, a ratio of 0.32 can correspond to a ratio of a numerator value of 8 and a denominator value of 25 (e.g., 0.32=8/25). Advantageously, the delay circuit 300 of FIGS. 3-4 and/or, more generally, the delay logic 106 can implement a 10-bit delay variation range of 1024 (e.g., 1024=32/0.03125) with a 5-bit control (e.g., codes 0-31, 32 step control, etc.). For example, the current mirror arrangement associated with MN0 316, the second transistors 318, and MN3 322 depicted in FIG. 3 can be adjusted (e.g., adjusted by the trim circuit 140 of FIG. 1), reconfigured, arranged, etc., to move with the ratio values of the fourth column 708 to implement the range of the sweep of the ratio values.

In the table 700 of FIG. 7, the ratios included in the fourth column 708 are representative of the delay circuit 300 configuring at least one of MN0 316, one or more of the second transistors 318, or MN3 322 in an arrangement that generates a non-linear, approximately exponential based change in the current ratio of the fourth column 708 by implementing an example mathematical approximation of $$\frac{1+x}{1-x} \approx e^{2x},$$

which results from the mathematical expression illustrated in the example of Equation (2) below:

$$\log_e\left(\frac{1+x}{1-x}\right) = 2\left[x + \frac{x^3}{3} + \frac{x^5}{5} + \ldots + \frac{x^{2n-1}}{2n-1} + \ldots\right], \quad \text{Equation (2)}$$

$$-1 < x < 1$$

As illustrated in the example of Equation (2) above, the delay circuit 300 and/or, more generally, the delay logic 106 of FIG. 1 can execute selective, linear control by controlling a switch position of one or more of the second transistors 318 to generate a non-linear, approximately exponential change in ratio. For example, a first change in codes from 29 to 30 causes a first change in current ratio of 10 to 15.5 while a second change (e.g., a subsequent change from the first change to the second change) in codes from 30 to 31 causes a second change in current ratio of 15.5 to 32. In such examples, a linear change in codes causes a non-linear, exponential-based change in current ratio.

In the table 700 of FIG. 7, the fifth column 710 includes multiplier (MULT) values in a range of 1.13 to 2.06. The multiplier values correspond to ratios of the ratios of the fourth column 708. For example, a multiplier value of 2.06 corresponds to a ratio of 0.03125 and 0.064516 (e.g., 2.06=0.064516/0.03125).

Figure 8:
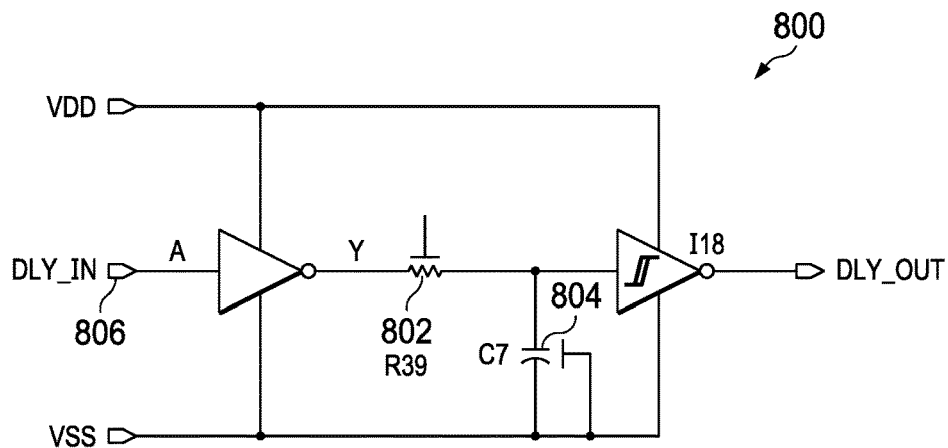
FIG. 8 depicts another example implementation of the delay logic of FIG. 1.

FIG. 8 depicts another example delay circuit 800. The delay circuit 800 of FIG. 8 is another example implementation of the delay logic 106 of FIG. 1. The delay circuit 800 of FIG. 8 is an RC delay circuit including an example resistor 802 and an example capacitor 804. The delay circuit 800 of FIG. 8 can delay signal (DLY_IN) 806 by a fixed time proportional to a product (e.g., a multiplication) of the resistance of the resistor 802 and the capacitance of the capacitor 804. The resistor 802 of FIG. 8 changes electrical characteristics based on temperature variations. Advantageously, the delay circuit 300 of FIGS. 3-4 is an improvement over the delay circuit 800 of FIG. 8 as the delay circuit 300 can generate different delay outputs independent or controlled dependence on of temperature through choice of IDRV.

In some examples, a gate driver (e.g., the gate driver 104 of FIG. 1) includes 1024 instances of the delay circuit 800 of FIG. 8 to implement a 10-bit delay range. Advantageously, a gate driver can include the delay circuit 300 of FIGS. 3-4 to implement the same 10-bit delay range of 1024 instances of the delay circuit 800 of FIG. 8. Advantageously, the delay circuit 300 of FIGS. 3-4 is substantially smaller in size compared to 1024 instances the delay circuit 800 of FIG. 8 as the have a greater size compared to that of FIG. 3 to execute changes in delay output.

Figure 9:
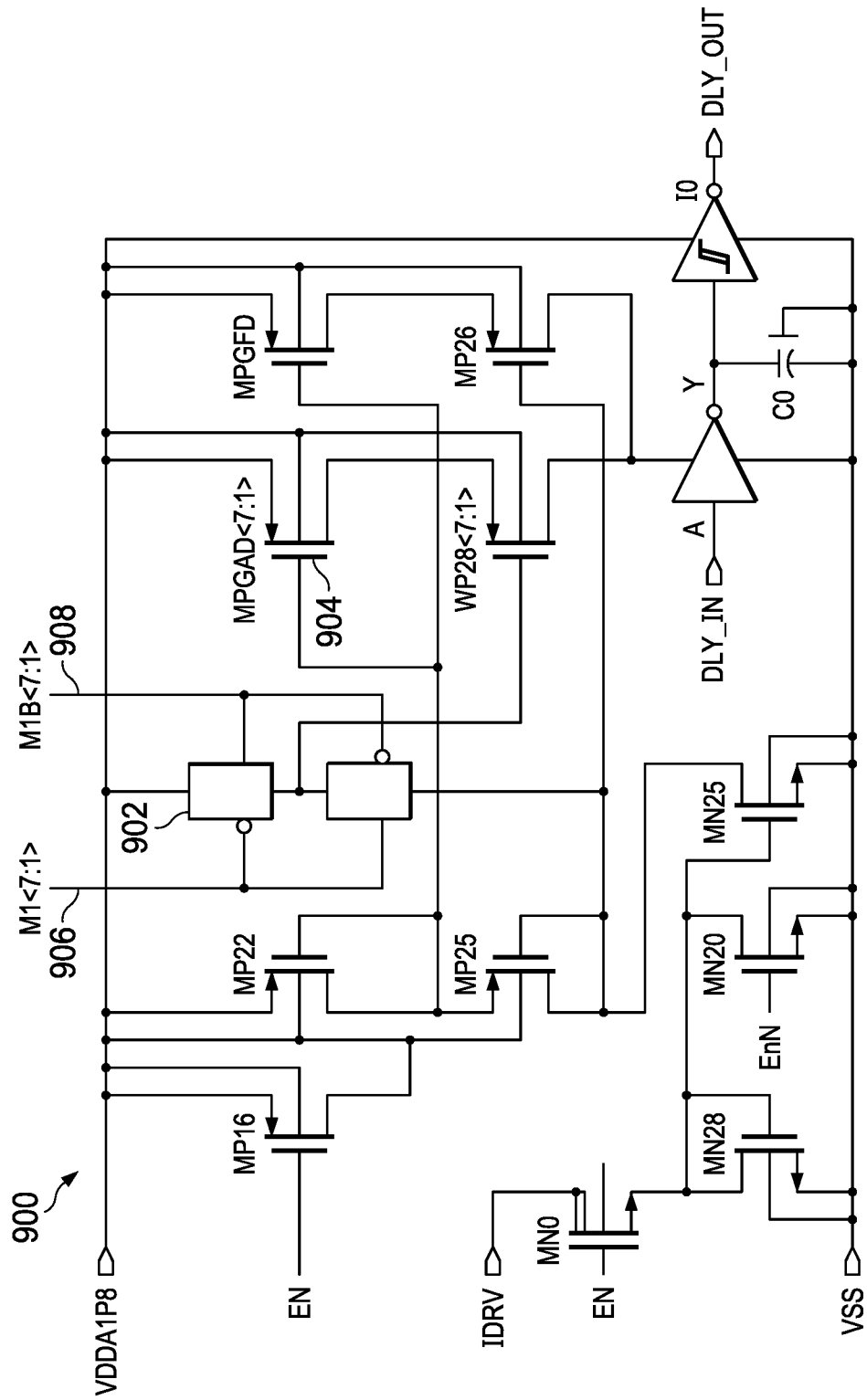
FIG. 9 depicts another example implementation of the delay logic of FIG. 1.

FIG. 9 depicts yet another example delay circuit 900. In FIG. 9, the delay circuit 900 is another example implementation of the delay logic 106 of FIG. 1. The delay circuit 900 of FIG. 9 is a digital-to-analog converter (DAC) based delay circuit. The delay circuit 900 of FIG. 9 can execute selectable control by controlling switches 902 and correspondingly coupled transistors 904. In FIG. 9, the switches 902 are controlled by signals (M1<7:1>) 906 and an inverse of the signals (M1B<7:1>) 908. For example, changing a setting of the switches 902 can control a change in the delay generated by the delay circuit 900.

In some examples, a gate driver (e.g., the gate driver 104 of FIG. 1) includes 1024 instances of the array including the switches 902 and the transistors 904 to implement a 10-bit delay range. Advantageously, a gate driver can include the delay circuit 300 of FIGS. 3-4 to implement the same 10-bit delay range as 1024 DAC elements (e.g., transistors and switches). Advantageously, the delay circuit 300 of FIGS. 3-4 is substantially smaller in size compared to the delay circuit 900 of FIG. 9 as only 32 elements (e.g., transistors and switches) of FIGS. 3-4 are needed compared to the delay circuit 900 of FIG. 9 to execute changes in delay output.

Figure 10:
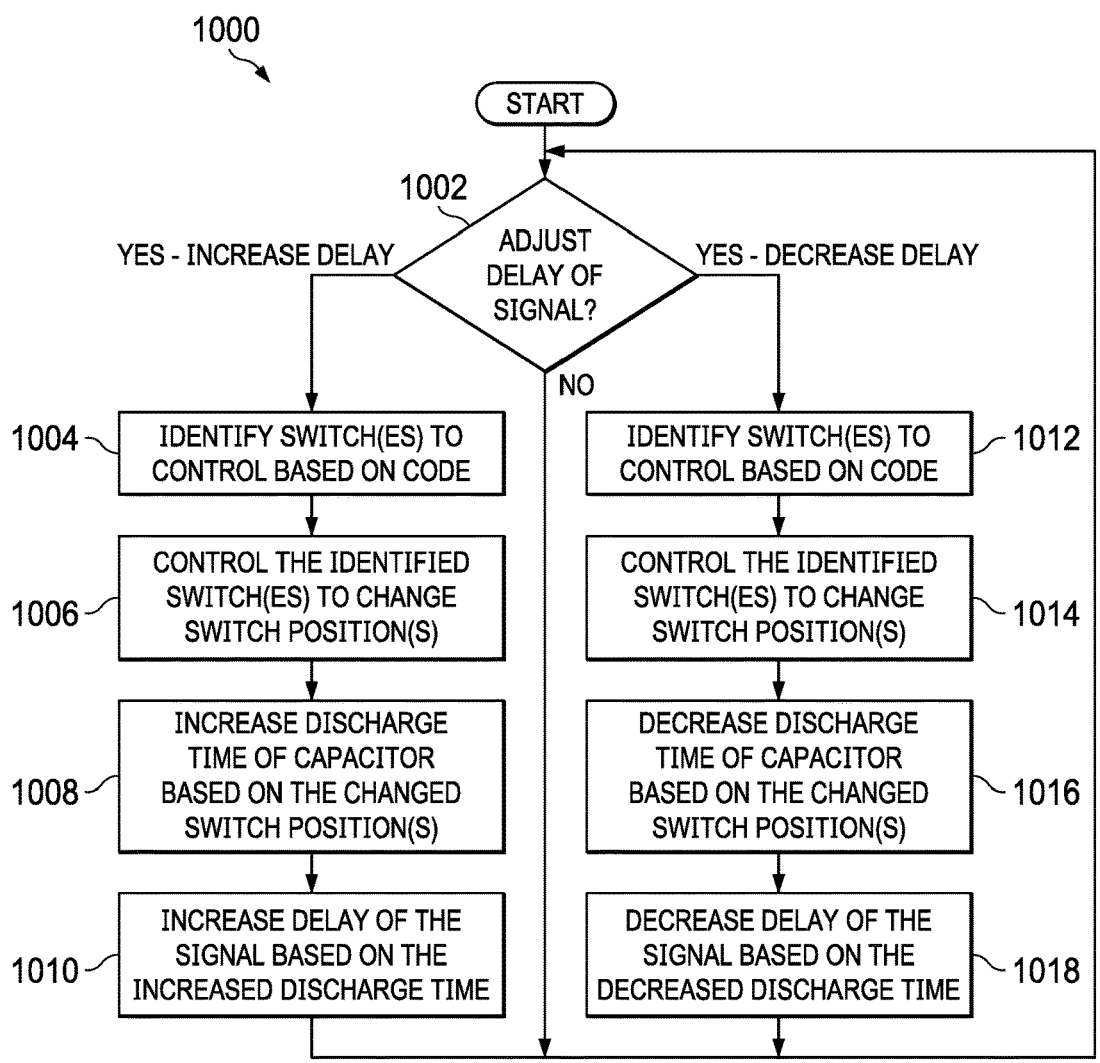
FIG. 10 is a flowchart representative of example machine readable instructions that may be executed to implement the gate driver of FIG. 1.

A flowchart representative of example hardware logic, machine readable instructions, hardware implemented state machines, and/or any combination thereof for implementing the computing system 141 of FIG. 1 and/or the gate driver 104 of FIG. 1 is shown in FIG. 10. The machine readable instructions may be one or more executable programs or portion(s) of an executable program for execution by one or more computer processors, one or more microcontrollers, etc., associated with and/or otherwise included in the computing system 141 of FIG. 1. For example, the machine readable instructions may be executed by one or more integrated circuits, logic circuits, microprocessors, GPUs, DSPs, or controllers from any desired family or manufacturer. For example, the one or more integrated circuits, logic circuits, microprocessors, GPUs, DSPs, or controllers may be semiconductor based (e.g., silicon based) device(s). The program may be embodied in software stored on a non-transitory computer readable storage medium such as non-volatile memory (e.g., read-only memory (ROM), electrically erasable programmable read-only memory (EEPROM), flash memory, etc.), volatile memory (e.g., Dynamic Random Access Memory (DRAM), Synchronous DRAM (SDRAM), etc., and/or any other type of random access memory (RAM) device), etc., associated with the one or more computer processors, the one or more microcontrollers, etc., but the entire program and/or parts thereof could alternatively be executed by a device other than the one or more computer processors, the one or more microcontrollers, etc., and/or embodied in firmware or dedicated hardware. Further, although the example program is described with reference to the flowchart illustrated in FIG. 10, many other methods of implementing the computing system 141 and/or the gate driver 104 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a compiled format, an executable format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: assembly or assembler language, C, C++, Java, C#, Perl, Python, JavaScript, HyperText Markup Language (HTML), Structured Query Language (SQL), Swift, etc.

As mentioned above, the example process of FIG. 10 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

FIG. 10 is a flowchart representative of example machine readable instructions 1000 that may be executed to implement the computing system 141 and/or the gate driver 104 of FIG. 1. The machine readable instructions 1000 begin at block at 1002, at which a determination of whether to adjust a delay of a signal is made. For example, the computing system 141 can generate and transmit a command to the gate driver 104 to increase delay of the signal 302 of FIG. 3, decrease delay of the signal 302, etc.

If, at block 1002, the determination is made to not adjust the delay of the signal control waits at block 1002. If, at block 1002, the determination is made to adjust the delay of the signal control by increasing the delay, control proceeds to block 1004.

At block 1004, the gate driver 104 identifies switch(es) to control based on a code. For example, the trim circuit 140 of the first gate drive circuit 112A can extract a code (e.g., one of the codes included in the first column 702 of the table 700 of FIG. 7) of 7 from a command obtained from the computing system 141. In such examples, the trim circuit 140 can map the code of 7 to a corresponding numerator value of 8, a denominator value of 25, etc., in the table 700. In some examples, the trim circuit 140 can identify SW1-SW7 320 to switch to the first switch position based on the numerator value of 8. In some examples, the trim circuit 140 can identify SW8-SW31 320 to switch to the second switch position based on the denominator value of 25.

At block 1006, the gate driver 104 controls the identified switch(es) to change switch position(s). For example, based on the numerator value of 8, the denominator value of 25, etc., the trim circuit 140 can adjust a switch position of SW1-SW7 320 of FIG. 3 to couple the drain 318D of MNX1-MNX7 318 to the third drain 322D of MN3 322. In such examples, based on the numerator value of 8, the denominator value of 25, etc., the trim circuit 140 can adjust a switch position of SW8-SW31 320 of FIG. 3 to couple the drain 318D of MNX8-MNX31 318 to the first drain 316D of MN0 316.

At block 1008, the gate driver 104 increases a discharge time of a capacitor based on the changed switch position(s). For example, the trim circuit 140 can invoke the delay circuit 300 and/or, more generally, the delay logic 106 of FIG. 1 to increase a discharge time of C0 310 based on the changed switch positions of SW1-SW7 320 (e.g., reducing a quantity of the second transistors 318 coupled to the third drain 322D to discharge C0 310).

At block 1010, the gate driver 104 increases a delay of the signal based on the increased discharge time. For example, the delay circuit 300 and/or, more generally, the delay logic 106 can increase a time duration during which the signal 302 is propagated from the first node 328 of FIGS. 3-4 to the seventh node 428 of FIG. 4 based on the increased discharge time associated with C0 310. In response to increasing the delay of the signal based on the increased discharge time at block 1010, control returns to block 1002 to determine whether to adjust the delay of the signal.

If, at block 1002, the determination is made to adjust the delay of the signal control by decreasing the delay, control proceeds to block 1012.

At block 1012, the gate driver 104 identifies switch(es) to control based on a code. For example, the trim circuit 140 of the first gate drive circuit 112A can extract a code (e.g., one of the codes included in the first column 702 of the table 700 of FIG. 7) of 25 from a command obtained from the computing system 141. In such examples, the trim circuit 140 can map the code of 25 to a corresponding numerator value of 26, a denominator value of 7, etc., in the table 700. In some examples, the trim circuit 140 can identify SW1-SW25 320 to switch to the first switch position based on the numerator value of 26. In some examples, the trim circuit 140 can identify SW26-SW31 320 to switch to the second switch position based on the denominator value of 7.

At block 1014, the gate driver 104 controls the identified switch(es) to change switch position(s). For example, based on the numerator value of 26, the denominator value of 7, etc., the trim circuit 140 can adjust a switch position of SW1-SW25 320 of FIG. 3 to couple the drain 318D of MNX1-MNX25 318 to the third drain 322D of MN3 322. In such examples, based on the numerator value of 26, the denominator value of 7, etc., the trim circuit 140 can adjust a switch position of SW26-SW31 320 of FIG. 3 to couple the drain 318D of MNX26-MNX31 318 to the first drain 316D of MN0 316.

At block 1016, the gate driver 104 decreases a discharge time of a capacitor based on the changed switch position(s). For example, the trim circuit 140 can invoke the delay circuit 300 and/or, more generally, the delay logic 106 of FIG. 1 to decrease a discharge time of C0 310 based on the changed switch positions of SW1-SW25 320 (e.g., increasing a quantity of the second transistors 318 coupled to the third drain 322D to discharge C0 310).

At block 1018, the gate driver 104 decreases a delay of the signal based on the decreased discharge time. For example, the delay circuit 300 and/or, more generally, the delay logic 106 can decrease a time duration during which the signal 302 is propagated from the first node 328 of FIGS. 3-4 to the seventh node 428 of FIG. 4 based on the decreased discharge time associated with C0 310. In response to decreasing the delay of the signal based on the decreased discharge time at block 1018, control returns to block 1002 to determine whether to adjust the delay of the signal.

From the foregoing, it will be appreciated that example systems, methods, apparatus, and articles of manufacture have been disclosed for implementing pulse train conditioning circuits. The disclosed systems, methods, apparatus, and articles of manufacture use and/or otherwise approximate an exponential function to generate a range of multiple orders of magnitude delay. The disclosed systems, methods, apparatus, and articles of manufacture can provide non-linear changes in delay output in response to selectable, defined input changes. The disclosed systems, methods, apparatus, and articles of manufacture use exponentially spaced delay points, control steps, etc., to facilitate a delay variation range implemented by different implementations of delay circuits but with substantially less number of elements, instances of delay circuits, and/or area on chip or on a semiconductor substrate.

Example methods, apparatus, systems, and articles of manufacture for pulse train conditioning circuits and related methods are disclosed herein. Further examples and combinations thereof include the following:

Example 1 includes a delay circuit comprising a first transistor having a first current terminal and a first gate terminal, a second transistor having a second current terminal and a second gate terminal, a third transistor having a third current terminal and a third gate terminal, a fourth transistor having a fourth current terminal and a fourth gate terminal, the fourth gate terminal coupled to the first gate terminal, the second gate terminal, and the third gate terminal, a first switch having a first terminal, a second terminal, and a third terminal, the first terminal coupled to the first current terminal, the second terminal coupled to the third current terminal, and the third terminal coupled to the fourth current terminal, and a second switch having a fourth terminal, a fifth terminal, and a sixth terminal, the fourth terminal coupled to the second current terminal, the fifth terminal coupled to the third current terminal, and the sixth terminal coupled to the fourth current terminal.

Example 2 includes the delay circuit of example 1, wherein the first switch and the second switch are in a first switch state, the first switch in the first switch state by coupling the first terminal to the second terminal, the first current terminal to be coupled to the third current terminal when the first switch is in the first switch state, the second switch in the first switch state by coupling the fourth terminal to the fifth terminal, the second current terminal to be coupled to the third current terminal when the second switch is in the first switch state.

Example 3 includes the delay circuit of example 1, wherein the first switch is in a first switch state and the second switch is in a second switch state different from the first switch state, the first switch in the first switch state by coupling the first terminal to the second terminal, the first current terminal to be coupled to the third current terminal when the first switch is in the first switch state, the second switch in the second switch state by coupling the fourth terminal to the sixth terminal, the second current terminal to be coupled to the fourth current terminal when the second switch is in the second switch state.

Example 4 includes the delay circuit of example 1, wherein the first switch and the second switch are in a first switch state, the first switch in the first switch state by coupling the first terminal to the third terminal, the first current terminal to be coupled to the fourth current terminal when the first switch is in the first switch state, the second switch in the first switch state by coupling the fourth terminal to the sixth terminal, the second current terminal to be coupled to the fourth current terminal when the second switch is in the first switch state.

Example 5 includes the delay circuit of example 1, wherein at least one of the first transistor, the second transistor, the third transistor, and the fourth transistor are field-effect transistors or bipolar junction transistors.

Example 6 includes the delay circuit of example 1, further including a fifth transistor having a fifth gate terminal, a fifth current terminal, and a sixth current terminal, the sixth current terminal coupled to the fourth current terminal, a sixth transistor having a sixth gate terminal and a seventh current terminal, the seventh current terminal coupled to the fifth current terminal, the fifth gate terminal coupled to the sixth gate terminal, a capacitor coupled to the fifth current terminal and the seventh current terminal, and a signal source coupled to the fifth gate terminal and the sixth gate terminal.

Example 7 includes the delay circuit of example 6, wherein the first transistor, the second transistor, the third transistor, the fourth transistor, and the fifth transistor are N-channel metal-oxide-semiconductor field-effect transistors (MOSFETs), and the sixth transistor is a P-channel MOSFET.

Example 8 includes an apparatus comprising a first transistor having a first current terminal and a first gate terminal, a second transistor having a second current terminal and a second gate terminal, the second gate terminal coupled to the first gate terminal, a third transistor having a third current terminal and a third gate terminal, the third gate terminal coupled to the first gate terminal and the second gate terminal, and a first switch coupled to the first current terminal, the second current terminal, and the third current terminal, the first switch configured to couple the third current terminal to the first current terminal or the second current terminal based on a code to adjust a ratio of a first quantity of one or more transistors over a second quantity of one or more transistors, the first quantity including at least the first transistor, the second quantity including at least the second transistor.

Example 9 includes the apparatus of example 8, further including fourth transistors having respective fourth gate terminals, the fourth gate terminals coupled to the first gate terminal, the second gate terminal, and the third gate terminal, the fourth transistors including the third transistor, and wherein each subsequent change in coupling of one of the fourth transistors from the first current terminal to the second current terminal causes an exponential change in current flowing through the second transistor based on a change in the ratio.

Example 10 includes the apparatus of example 8, further including a fourth transistor and a capacitor, the fourth transistor coupled to the capacitor and the second transistor, and when the third current terminal is coupled to the second current terminal, the fourth transistor to facilitate a current to flow from the capacitor through the second transistor, the third transistor, and the fourth transistor.

Example 11 includes the apparatus of example 8, wherein when the third current terminal is coupled to the first current terminal, a current is to flow through the first transistor and the third transistor.

Example 12 includes the apparatus of example 8, further including a fourth transistor and a capacitor, the fourth transistor coupled to the capacitor and the second transistor, and wherein the third transistor to reduce a discharge rate of the capacitor when the third current terminal is coupled to the first current terminal, and the third transistor to increase the discharge rate of the capacitor when the third current terminal is coupled to the second current terminal.

Example 13 includes the apparatus of example 8, wherein the ratio is a first ratio, and the adjustment of the first ratio adjusts a second ratio of a first current flowing through the first transistor over a second current flowing through the second transistor.

Example 14 includes the apparatus of example 8, further including a fourth transistor and a capacitor, the fourth transistor coupled to the capacitor and the second transistor, and wherein the capacitor is to discharge at a first rate in response to the first quantity being greater than the second quantity, and the capacitor is to discharge at a second rate in response to the first quantity being less than the second quantity, the first rate less than the second rate.

Example 15 includes the apparatus of example 8, further including a capacitor, a fourth transistor having a fourth gate terminal, the fourth transistor coupled to the capacitor and the second transistor, and a controller coupled to the fourth gate terminal, the controller to generate a pulse signal to control the fourth transistor to adjust a voltage associated with the capacitor.

Example 16 includes a system comprising a power converter, a gate driver coupled to the power converter, the gate driver including a trim circuit, and delay logic coupled to the trim circuit, the delay logic including first transistors, a second transistor coupled to the first transistors, a third transistor coupled to the second transistor, switches, each of the switches coupled to a respective one of the first transistors, the switches to couple a set of the first transistors to a current terminal of the third transistor, a capacitor, and a fourth transistor coupled to the capacitor and the third transistor, the fourth transistor to discharge the capacitor by facilitating a current to flow from the capacitor through the set of the first transistors, the third transistor, and the fourth transistor.

Example 17 includes the system of example 16, wherein the power converter includes a first Gallium Nitride (GaN) transistor and a second GaN transistor, the first GaN and the second GaN coupled to the gate driver, and further including a load coupled to the power converter.

Example 18 includes the system of example 16, wherein the current is a first current flowing through the third transistor, the switches coupling the set of the first transistors to the current terminal of the third transistor adjusts a ratio of the first current and a second current flowing through the second transistor, and each subsequent change in coupling of one of the first transistors from the second transistor to the current terminal of the third transistor causes an exponential change in the ratio.

Example 19 includes the system of example 16, wherein the set of the first transistors is a first set, the current is based on a current ratio, and the current ratio is determined by dividing a first quantity of transistors by a second quantity of transistors, the first quantity of transistors corresponding to a first sum of the third transistor and the first set of the first transistors, the second quantity of transistors corresponding to a second sum of the second transistor and a second set of the first transistors.

Example 20 includes the system of example 19, wherein the capacitor is to discharge at a first rate in response to the first quantity of transistors being greater than the second quantity of transistors, and the capacitor is to discharge at a second rate in response to the first quantity of transistors being less than the second quantity of transistors, the first rate greater than the second rate.

Although certain example systems, methods, apparatus and articles of manufacture have been disclosed herein, the scope of coverage of this patent is not limited thereto. On the contrary, this patent covers all systems, methods, apparatus and articles of manufacture fairly falling within the scope of the claims of this patent.

The following claims are hereby incorporated into this Detailed Description by this reference, with each claim standing on its own as a separate embodiment of the present disclosure.

What is claimed is:

1. A delay circuit comprising:
 a first transistor having a first current terminal and a first gate terminal;
 a second transistor having a second current terminal and a second gate terminal;
 a third transistor having a third current terminal and a third gate terminal;

a fourth transistor having a fourth current terminal and a fourth gate terminal, the fourth gate terminal coupled to the first gate terminal, the second gate terminal, and the third gate terminal;
a first switch having a first terminal, a second terminal, and a third terminal, the first terminal coupled to the first current terminal, the second terminal coupled to the third current terminal, and the third terminal coupled to the fourth current terminal; and
a second switch having a fourth terminal, a fifth terminal, and a sixth terminal, the fourth terminal coupled to the second current terminal, the fifth terminal coupled to the third current terminal, and the sixth terminal coupled to the fourth current terminal.

2. The delay circuit of claim 1, wherein the first switch and the second switch are in a first switch state, the first switch in the first switch state by coupling the first terminal to the second terminal, the first current terminal to be coupled to the third current terminal when the first switch is in the first switch state, the second switch in the first switch state by coupling the fourth terminal to the fifth terminal, the second current terminal to be coupled to the third current terminal when the second switch is in the first switch state.

3. The delay circuit of claim 1, wherein the first switch is in a first switch state and the second switch is in a second switch state different from the first switch state, the first switch in the first switch state by coupling the first terminal to the second terminal, the first current terminal to be coupled to the third current terminal when the first switch is in the first switch state, the second switch in the second switch state by coupling the fourth terminal to the sixth terminal, the second current terminal to be coupled to the fourth current terminal when the second switch is in the second switch state.

4. The delay circuit of claim 1, wherein the first switch and the second switch are in a first switch state, the first switch in the first switch state by coupling the first terminal to the third terminal, the first current terminal to be coupled to the fourth current terminal when the first switch is in the first switch state, the second switch in the first switch state by coupling the fourth terminal to the sixth terminal, the second current terminal to be coupled to the fourth current terminal when the second switch is in the first switch state.

5. The delay circuit of claim 1, wherein at least one of the first transistor, the second transistor, the third transistor, and the fourth transistor are field-effect transistors or bipolar junction transistors.

6. The delay circuit of claim 1, further including:
a fifth transistor having a fifth gate terminal, a fifth current terminal, and a sixth current terminal, the sixth current terminal coupled to the fourth current terminal;
a sixth transistor having a sixth gate terminal and a seventh current terminal, the seventh current terminal coupled to the fifth current terminal, the fifth gate terminal coupled to the sixth gate terminal;
a capacitor coupled to the fifth current terminal and the seventh current terminal; and
a signal source coupled to the fifth gate terminal and the sixth gate terminal.

7. The delay circuit of claim 6, wherein the first transistor, the second transistor, the third transistor, the fourth transistor, and the fifth transistor are N-channel metal-oxide-semiconductor field-effect transistors (MOSFETs), and the sixth transistor is a P-channel MOSFET.

8. An apparatus comprising:
a first transistor having a first current terminal and a first gate terminal;
a second transistor having a second current terminal and a second gate terminal, the second gate terminal coupled to the first gate terminal;
a third transistor having a third current terminal and a third gate terminal, the third gate terminal coupled to the first gate terminal and the second gate terminal; and
a first switch coupled to the first current terminal, the second current terminal, and the third current terminal, the first switch configured to couple the third current terminal to the first current terminal or the second current terminal based on a code to adjust a ratio of a first quantity of one or more transistors over a second quantity of one or more transistors, the first quantity including at least the first transistor, the second quantity including at least the second transistor.

9. The apparatus of claim 8, further including fourth transistors having respective fourth gate terminals, the fourth gate terminals coupled to the first gate terminal, the second gate terminal, and the third gate terminal, the fourth transistors including the third transistor, and wherein each subsequent change in coupling of one of the fourth transistors from the first current terminal to the second current terminal causes an exponential change in current flowing through the second transistor based on a change in the ratio.

10. The apparatus of claim 8, further including a fourth transistor and a capacitor, the fourth transistor coupled to the capacitor and the second transistor, and when the third current terminal is coupled to the second current terminal, the fourth transistor to facilitate a current to flow from the capacitor through the second transistor, the third transistor, and the fourth transistor.

11. The apparatus of claim 8, wherein when the third current terminal is coupled to the first current terminal, a current is to flow through the first transistor and the third transistor.

12. The apparatus of claim 8, further including a fourth transistor and a capacitor, the fourth transistor coupled to the capacitor and the second transistor, and wherein:
the third transistor to reduce a discharge rate of the capacitor when the third current terminal is coupled to the first current terminal; and
the third transistor to increase the discharge rate of the capacitor when the third current terminal is coupled to the second current terminal.

13. The apparatus of claim 8, wherein the ratio is a first ratio, and the adjustment of the first ratio adjusts a second ratio of a first current flowing through the first transistor over a second current flowing through the second transistor.

14. The apparatus of claim 8, further including a fourth transistor and a capacitor, the fourth transistor coupled to the capacitor and the second transistor, and wherein the capacitor is to discharge at a first rate in response to the first quantity being greater than the second quantity, and the capacitor is to discharge at a second rate in response to the first quantity being less than the second quantity, the first rate less than the second rate.

15. The apparatus of claim 8, further including:
a capacitor;
a fourth transistor having a fourth gate terminal, the fourth transistor coupled to the capacitor and the second transistor; and
a controller coupled to the fourth gate terminal, the controller to generate a pulse signal to control the fourth transistor to adjust a voltage associated with the capacitor.

16. A system comprising:
a power converter;
a gate driver coupled to the power converter, the gate driver including:
a trim circuit; and
delay logic coupled to the trim circuit, the delay logic including:
first transistors;
a second transistor coupled to the first transistors;
a third transistor coupled to the second transistor;
switches, each of the switches coupled to a respective one of the first transistors, the switches to couple a set of the first transistors to a current terminal of the third transistor;
a capacitor; and
a fourth transistor coupled to the capacitor and the third transistor, the fourth transistor to discharge the capacitor by facilitating a current to flow from the capacitor through the set of the first transistors, the third transistor, and the fourth transistor.

17. The system of claim 16, wherein the power converter includes a first Gallium Nitride (GaN) transistor and a second GaN transistor, the first GaN and the second GaN coupled to the gate driver, and further including a load coupled to the power converter.

18. The system of claim 16, wherein the current is a first current flowing through the third transistor, the switches coupling the set of the first transistors to the current terminal of the third transistor adjusts a ratio of the first current and a second current flowing through the second transistor, and each subsequent change in coupling of one of the first transistors from the second transistor to the current terminal of the third transistor causes an exponential change in the ratio.

19. The system of claim 16, wherein the set of the first transistors is a first set, the current is based on a current ratio, and the current ratio is determined by dividing a first quantity of transistors by a second quantity of transistors, the first quantity of transistors corresponding to a first sum of the third transistor and the first set of the first transistors, the second quantity of transistors corresponding to a second sum of the second transistor and a second set of the first transistors.

20. The system of claim 19, wherein the capacitor is to discharge at a first rate in response to the first quantity of transistors being greater than the second quantity of transistors, and the capacitor is to discharge at a second rate in response to the first quantity of transistors being less than the second quantity of transistors, the first rate greater than the second rate.

* * * * *